United States Patent
Lee

(10) Patent No.: US 11,094,735 B2
(45) Date of Patent: Aug. 17, 2021

(54) IMAGE SENSOR

(71) Applicant: SAMSUNG ELECTRONICS CO., LTD., Suwon-si (KR)

(72) Inventor: Kyung Ho Lee, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 16/291,345

(22) Filed: Mar. 4, 2019

(65) Prior Publication Data

US 2020/0027914 A1    Jan. 23, 2020

(30) Foreign Application Priority Data

Jul. 23, 2018 (KR) .................. 10-2018-0085245

(51) Int. Cl.
| | | |
|---|---|---|
| *H01L 27/146* | (2006.01) | |
| *H04N 5/378* | (2011.01) | |
| *H04N 5/355* | (2011.01) | |

(52) U.S. Cl.
CPC .. *H01L 27/14645* (2013.01); *H01L 27/14607* (2013.01); *H01L 27/14612* (2013.01); *H04N 5/3559* (2013.01); *H04N 5/378* (2013.01); *H01L 27/14621* (2013.01); *H01L 27/14627* (2013.01)

(58) Field of Classification Search
CPC ......... H01L 27/14636; H01L 27/14634; H01L 2924/00; H01L 27/1464; H01L 27/14621
See application file for complete search history.

(56) References Cited

U.S. PATENT DOCUMENTS

| | | |
|---|---|---|
| 8,059,174 B2 | 11/2011 | Mann et al. |
| 8,675,121 B2 | 3/2014 | Yamasaki |
| 9,911,777 B2 | 3/2018 | Lee et al. |
| 2016/0307948 A1 | 10/2016 | Stark |
| 2017/0310908 A1 | 10/2017 | Hatakeyama |
| 2017/0338264 A1 | 11/2017 | Kwag et al. |
| 2018/0041688 A1 | 2/2018 | Johnson |
| 2018/0047773 A1 | 2/2018 | Gomi |
| 2018/0054578 A1* | 2/2018 | Kitamori ................ H04N 5/347 |
| 2020/0186732 A1* | 6/2020 | Takizawa ........... H04N 5/37452 |

* cited by examiner

*Primary Examiner* — Tony Tran

(74) *Attorney, Agent, or Firm* — F. Chau & Associates, LLC

(57) ABSTRACT

An image sensor includes a pixel array including a plurality of pixels arranged in a first direction and a second direction. Each pixel of the plurality of pixels includes a plurality of photodiodes disposed adjacent to one another in at least one of the first direction and the second direction. The image sensor further includes a control logic configured to generate image data by obtaining pixel signals from the plurality of pixels, and read a pixel voltage corresponding to charges generated by two or more of the plurality of photodiodes included in one of the plurality of pixels, at substantially the same time.

18 Claims, 20 Drawing Sheets

IMAGE SENSOR

CROSS-REFERENCE TO RELATED APPLICATIONS

This application claims priority under 35 U.S.C. § 119 to Korean Patent Application No. 10-2018-0085245 filed on Jul. 23, 2018 in the Korean Intellectual Property Office, the disclosure of which is incorporated by reference herein in its entirety.

TECHNICAL FIELD

Example embodiments of the present inventive concept relate to an image sensor.

DISCUSSION OF THE RELATED ART

An image sensor is a semiconductor-based sensor that receives light to generate an electrical signal. An image sensor may include a pixel array having a plurality of pixels, and a logic circuit that drives the pixel array and generates an image. The plurality of pixels may include a photodiode that generates charges in response to external light, and a pixel circuit that converts charges generated by the photodiode into an electrical signal. The image sensor may be applied to a wide variety of devices. For example, the image sensor may be used in a smartphone, a tablet PC, a laptop computer, a television, a vehicle, etc., in addition to being used in a general camera for capturing photos or videos. Recently, various methods for improving an autofocusing function of the image sensor have been proposed to improve the quality of an image captured by the image sensor.

SUMMARY

Example embodiments of the present inventive concept provide an image sensor capable of providing an improved autofocusing function, and capable of improving a read-out time for reading a pixel voltage, improving power consumption according to a read-out operation, and improving a noise characteristic.

According to an example embodiment of the present inventive concept, an image sensor includes a pixel array and a control logic. The pixel array includes a plurality of pixels arranged in a first direction and a second direction. Each of the plurality of pixels includes a plurality of photodiodes divided into a first photodiode group and a second photodiode group, and at least one of the first photodiode group and the second photodiode group comprises two or more of the plurality of photodiodes being adjacent to one another in at least one of the first direction and the second direction. The control logic is configured to generate image data by obtaining pixel signals from the plurality of pixels, and read a pixel voltage corresponding to charges generated by two or more of the plurality of photodiodes included in one of the plurality of pixels, at substantially the same time.

According to an example embodiment of the present inventive concept, an image sensor includes a pixel array and a control logic. The pixel array includes a plurality of pixels. The control logic is configured to generate image data using charges generated in each of the plurality of pixels. Each of the plurality of pixels includes a plurality of photodiodes formed at about a same depth in a semiconductor substrate, a pixel circuit below the plurality of photodiodes, and a device connection layer that physically connects at least portions of the plurality of photodiodes to each other and being disposed between the pixel circuit and the plurality of photodiodes.

According to an example embodiment of the present inventive concept, an image sensor includes a pixel array and a control logic circuit. The pixel array includes a plurality of pixels. The control logic circuit is configured to generate image data using charges generated in each of the plurality of pixels. Each of the plurality of pixels includes a plurality of photodiodes formed at about a same depth in a semiconductor substrate, a plurality of transfer transistors connected to the plurality of photodiodes, and a connection line that connects gate electrode layers of at least a portion of transfer transistors among the plurality of transfer transistors to each other.

BRIEF DESCRIPTION OF THE DRAWINGS

The above and other features of the present inventive concept will become more apparent by describing in detail example embodiments thereof with reference to the accompanying drawings, in which.

DETAILED DESCRIPTION

Figure 1:
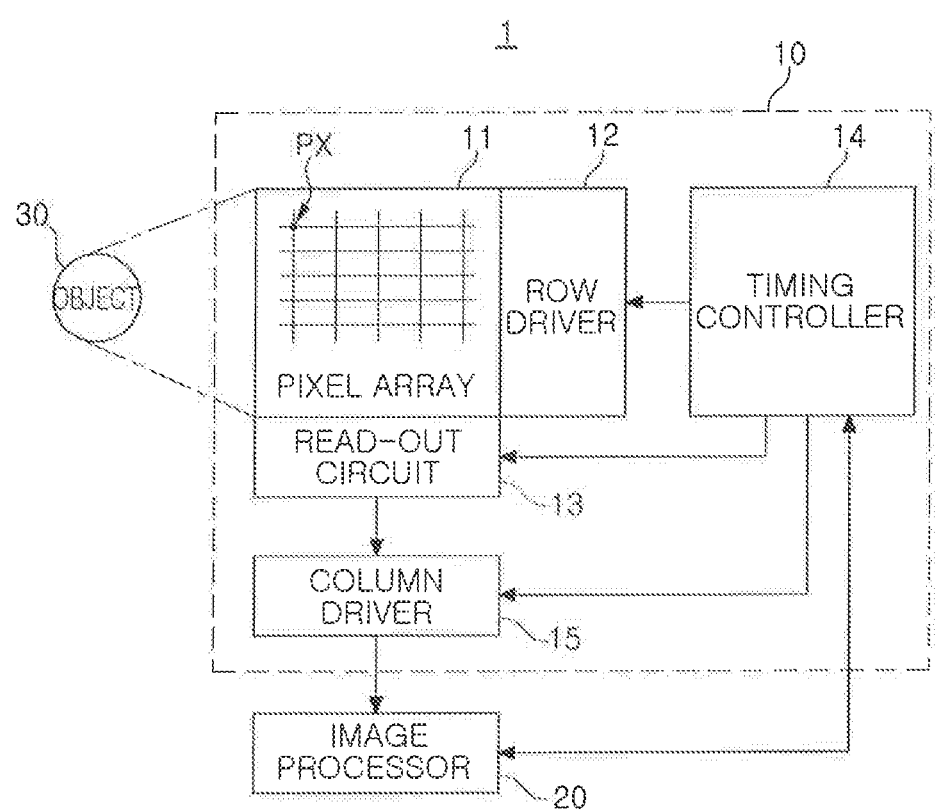
FIG. 1 is a diagram illustrating an image processing apparatus including an image sensor, according to an example embodiment of the present inventive concept.

Example embodiments of the present inventive concept will be described more fully hereinafter with reference to the accompanying drawings. Like reference numerals may refer to like elements throughout the accompanying drawings.

Herein, spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below.

Further, it should be understood that descriptions of features or aspects within each example embodiment should typically be considered as available for other similar features or aspects in other example embodiments, unless the context clearly indicates otherwise.

Further, when two or more elements or values are described as being substantially the same as or about equal to each other, it is to be understood that the elements or values are identical to each other, indistinguishable from each other, or distinguishable from each other but functionally the same as each other as would be understood by a person having ordinary skill in the art. It will be further understood that when two components or directions are described as extending substantially parallel or perpendicular to each other, the two components or directions extend exactly parallel or perpendicular to each other, or extend approximately parallel or perpendicular to each other within a measurement error as would be understood by a person having ordinary skill in the art. Further, it is to be understood that while parameters may be described herein as having "about" a certain value, according to example embodiments, the parameter may be exactly the certain value or approximately the certain value within a measurement error as would be understood by a person having ordinary skill in the art.

Further, when two or more processes or events are described as being performed at or occurring at substantially the same time (or substantially simultaneously), it is to be understood that the processes or events may be performed at or may occur at exactly the same time, or at about the same time as would be understood by a person having ordinary skill in the art. For example, the processes or events may be performed at or may occur at about the same time within a measurement error as would be understood by a person having ordinary skill in the art.

FIG. 1 is a diagram illustrating an image processing apparatus including an image sensor, according to an example embodiment of the present inventive concept.

Referring to FIG. 1, an image processing apparatus 1 according to an example embodiment of the present inventive concept may include an image sensor 10 and an image processor 20. The image sensor 10 may include a pixel array 11, a row driver 12, a read-out circuit 13, a column driver 15, and a timing controller 14. The row driver 12, the read-out circuit 13, the column driver 15, and the timing controller 14 are circuits used to control the pixel array 11, and may be included in a control logic, as described in further detail below. In an example embodiment, additional components may be included in the image sensor 10.

The image sensor 10 may operate according to a control command received from the image processor 20, and may convert light from an object 30 into an electrical signal and output the electrical signal to the image processor 20. The pixel array 11 included in the image sensor 10 may include a plurality of pixels PX, and the plurality of pixels PX may include photoelectric elements that receive light and generate charges. A photoelectric element may be, for example, a photodiode PD. In an example embodiment, at least one of the plurality of pixels PX may include two or more photodiodes, and the image sensor 10 may provide an autofocusing function by using a phase difference of a pixel signal generated by each of two or more photodiodes included in at least one of the plurality of pixels PX.

In an example embodiment, each pixel of the plurality of pixels PX may include a pixel circuit that generates a pixel signal from charges generated by the photodiodes. In an example embodiment, the pixel circuit may include, for example, a transfer transistor, a driving transistor, a selection transistor, and a reset transistor. The pixel circuit may obtain the pixel signal by detecting a reset voltage and a pixel voltage from each of the plurality of pixels PX and calculating the difference. The pixel voltage may be a voltage at which charges generated in the photodiodes included in each pixel of the plurality of pixels PX are reflected.

When the plurality of pixels PX have two or more photodiodes, each of the plurality of pixels PX may include a pixel circuit that processes charges generated in each of the two or more photodiodes. For example, according to example embodiments, the pixel circuit may include two or more of at least one of the transfer transistor, the drive transistor, the selection transistor, and the reset transistor.

The row driver 12 may drive the pixel array 11 on a row basis. For example, the row driver 12 may generate a transfer control signal that controls the transfer transistor of the pixel circuit, a reset control signal that controls the reset transistor of the pixel circuit, and a selection control signal that controls the selection transistor of the pixel circuit.

The read-out circuit 13 may include, for example, a correlated double sampler CDS, an analog-to-digital converter ADC, etc. The correlated double sampler may be connected to the pixels PX included in the row selected by the row selection signal supplied from the row driver 12 through the column lines, and may perform correlated double sampling to detect the reset voltage and the pixel voltage. The analog-to-digital converter may convert the reset voltage and the pixel voltage detected by the correlated double sampler into a digital signal and transmit the converted voltages to the read-out circuit 15.

The column driver 15 may include, for example, a latch or buffer circuit capable of temporarily storing the digital signal, an amplifying circuit, etc., and may temporarily store or amplify the digital signal received from the column driver 13 to generate image data. Operation timings of the row driver 12, the read-out circuit 13, and the column driver 15 may be determined by the timing controller 14, and the timing controller 14 may operate based on a control command transmitted from the image processor 20. The image processor 20 may signal-process the image data output from the read-out circuit 15 to output the image data to a display device, or may store the image data in a storage device such as a memory. In an example embodiment, the image processing apparatus 1 may be mounted on an autonomous vehicle, and the image processor 20 may signal-process the image data and transmit the image data to a main controller to control the autonomous vehicle.

Figure 2:
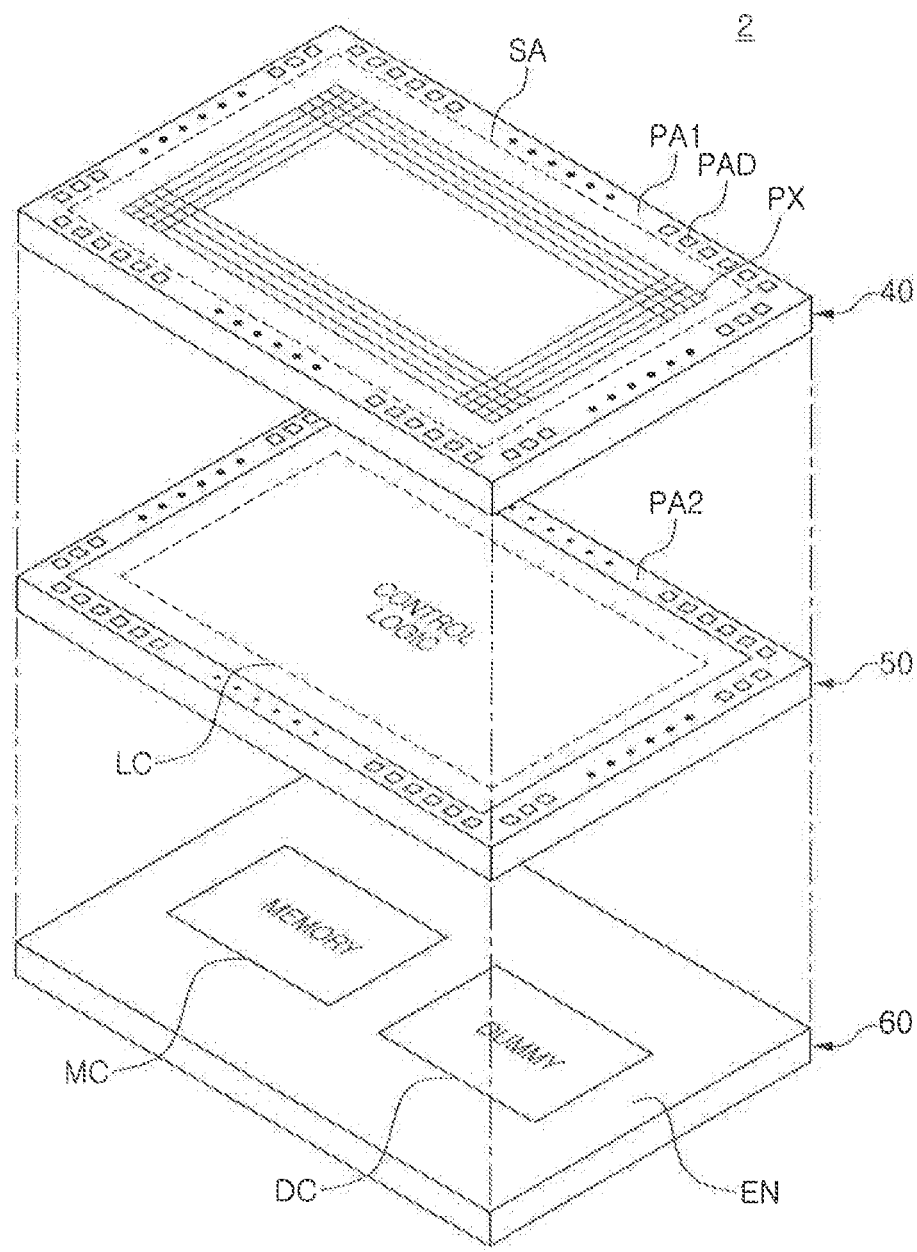
FIGS. 2 and 3 are diagrams illustrating an image sensor, according to example embodiments of the present inventive concept.
Figure 3:
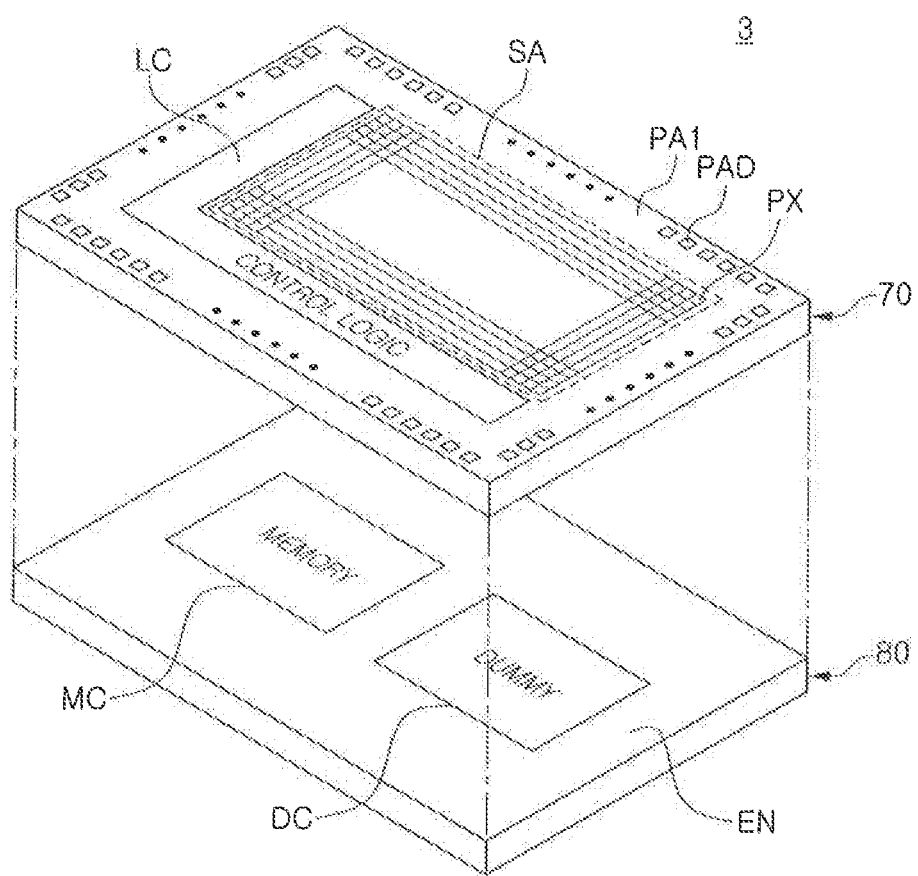

FIGS. 2 and 3 are diagrams illustrating an image sensor, according to example embodiments of the present inventive concept.

For convenience of explanation, a duplicative description of elements and technical aspects described with reference to FIG. 2 may be omitted when describing FIG. 3.

First, referring to FIG. 2, an image sensor 2 according to an example embodiment of the present inventive concept may include a first layer 40, a second layer 50 disposed below the first layer 40, and a third layer 60 disposed below the second layer 50. In an example embodiment, additional layers may be included. The first layer 40, the second layer 50, and the third layer 60 may be stacked in a direction substantially perpendicular to each other. In an example embodiment, the first layer 40 and the second layer 50 may be stacked on each other at a wafer level, and the third layer 60 may be attached to a lower portion of the second layer 50 at a chip level. The first to third layers 40 to 60 may be disposed in one semiconductor package.

The first layer 40 may be a semiconductor substrate that includes a sensing area SA in which a plurality of pixels PX is disposed, and a first pad area PA1 disposed around the sensing area SA. A plurality of upper pads PAD may be included in the first pad area PA1. The plurality of upper pads PAD may be connected to pads disposed in a second pad area PA2 of the second layer 50 and a control logic LC through, for example, a via.

Each of the plurality of pixels PX may include, for example, a photodiode that receives light and generates charges, and a pixel circuit that processes the charges generated by the photodiode. The pixel circuit may include a plurality of transistors that output a voltage corresponding to the charge generated by the photodiode.

The second layer 50 may include a plurality of devices that form the control logic LC. The plurality of devices included in the control logic LC may be configured to provide circuits that drive the pixel circuit disposed in the first layer 40. Herein, the control logic LC may also be referred to as a control logic circuit. Thus, herein, the terms "control logic" and "control logic circuit" may be used interchangeably. The plurality of devices may include, for example, the row driver 12, the column driver 13, and the timing controller 14, as well as additional devices. The plurality of devices included in the control logic LC may be connected to the pixel circuit through the first and second pad areas PA1 and PA2. The control logic LC may obtain a reset voltage and a pixel voltage from the plurality of pixels PX, and may generate a pixel signal using the reset voltage and the pixel voltage.

In an example embodiment, at least one of the plurality of pixels PX may include a plurality of photodiodes disposed on the same level. The pixel signals generated from the charges of each of the plurality of photodiodes may have a phase difference from each other, and the control logic LC may provide an autofocusing function based on the phase difference of the pixel signals generated by the plurality of photodiodes included in one pixel PX.

The third layer 60 disposed below the second layer 50 may include a memory chip MC and a dummy chip DC, and a protection layer EN that seals the memory chip MC and the dummy chip DC. The memory chip MC may be, for example, a dynamic random access memory DRAM or a static random access memory SRAM. The dummy chip DC is not capable of actually storing data. The memory chip MC may be electrically connected to at least a portion of the devices included in the control logic LC of the second layer 50 by, for example, bumps, and may store information necessary to provide the autofocusing function. In an example embodiment, the bumps may be, for example, microbumps.

Next, referring to FIG. 3, an image sensor 3 according to an example embodiment may include a first layer 70 and a second layer 80. The first layer 70 may include a sensing area SA in which a plurality of pixels PX are disposed, a control logic LC in which devices that drive the plurality of pixels PX are disposed, and a first pad area PA1 disposed around the sensing area SA and the control logic LC. A plurality of upper pads PAD may be included in the first pad area PA1. The plurality of upper pads PAD may be connected to a memory chip MC disposed in the second layer 80 by, for example, a via. The second layer 80 may include, for example, the memory chip MC, a dummy chip DC, and a protective layer EN that seals the memory chip MC and the dummy chip DC.

Figure 4:
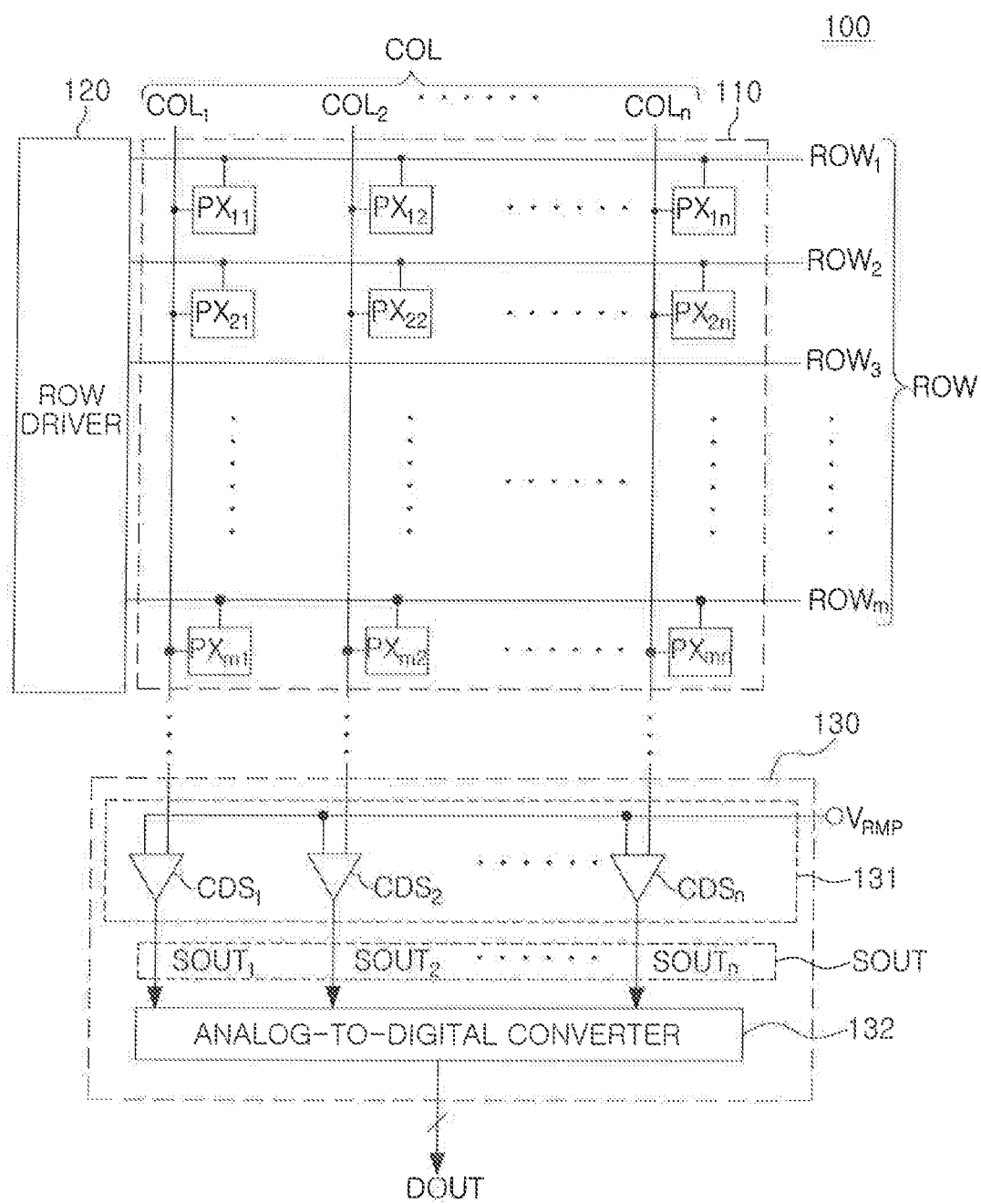
FIG. 4 is a diagram illustrating an operation of an image sensor, according to an example embodiment of the present inventive concept.

FIG. 4 is a diagram illustrating an operation of an image sensor, according to an example embodiment of the present inventive concept.

Referring to FIG. 4, an image sensor 100 according to an example embodiment of the present inventive concept may include, for example, a pixel array 110, a row driver 120, and a read-out circuit 130. The row driver 120 may input a transfer control signal, a reset control signal, a selection control signal, etc. to each pixel circuit through row lines ROW1 to ROWm included in a plurality of row lines ROW. The read-out circuit 130 may detect the pixel voltage and the reset voltage from the pixels PX connected to the row line ROW selected by the row driver 120. The read-out circuit 130 may include, for example, a sampling circuit 131 including a plurality of correlated double samplers CDS1 to CDSn, and an analog-to-digital converter 132 that converts outputs of the sampling circuit 131 SOUT1 to SOUTn included in a plurality of outputs SOUT into digital data. The digital data may correspond to, for example, DOUT in FIG. 4, which may be output by the analog-to-digital converter 132.

The pixel array 110 may include the plurality of row lines ROW extending in one direction, and column lines COL1 to COLn included in a plurality of column lines COL intersecting the row lines ROW. The row lines ROW and the column lines COL may be connected to pixels PX11 to PXmn. Each of the pixels PX11 to PXmn may include the photodiode and the pixel circuit. In an example embodiment, each of the pixels PX11 to PXmn may include the plurality of photodiodes disposed on the same level, which are used to provide the autofocusing function.

Referring to a comparative example, when each pixel of the plurality of pixels PX11 to PXmn includes the plurality of photodiodes used to provide the autofocusing function, the read-out circuit 130 may detect pixel voltages from each of the plurality of photodiodes. Therefore, since the pixel voltages are detected a plurality of times from each of the pixels PX11 to PXmn, the time and the power consumption required for the read-out operation may be increased. In addition, since the pixel voltage is detected from the photodiodes of each of the pixels PX11 to PXmn, a noise component appearing in the read-out operation may increase, and the performance of the image sensor 100 may be degraded.

In contrast, in an example embodiment of the present inventive concept, to solve the above-described problem that may occur in the comparative example, the pixel voltage at which the charge generated by at least a portion of the plurality of photodiodes included in each of the pixels PX11 to PXmn is reflected may be read substantially simultaneously. As a result, the time and the power consumption required for the read-out operation may be reduced, the number of times the read-out operation is performed may be reduced, and the noise component may be reduced, which may result in improved performance of the image sensor 100.

Figure 5:
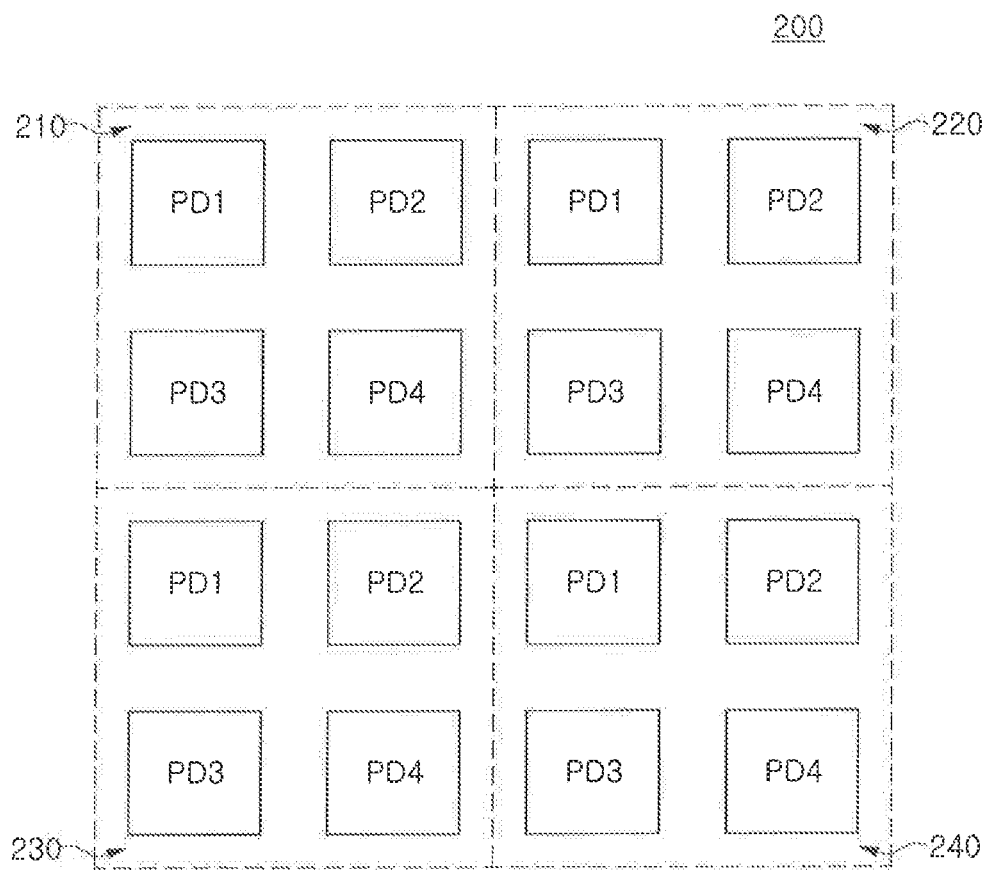
FIG. 5 is a diagram illustrating a pixel array of an image sensor, according to an example embodiment of the present inventive concept.
Figure 5:
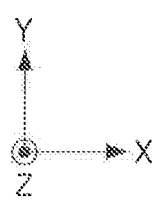

FIG. 5 is a diagram illustrating a pixel array of an image sensor, according to an example embodiment of the present inventive concept.

Referring to FIG. 5, a pixel array 200 of an image sensor according to an example embodiment of the present inventive concept may include a plurality of pixels 210, 220, 230 and 240. The plurality of pixels 210 to 240 may be arranged in a first direction (X-axis direction) and in a second direction (Y-axis direction). Each pixel of the plurality of pixels 210 to 240 may include a plurality of photodiodes PD1, PD2, PD3 and PD4. In the example embodiment illustrated in FIG. 5, each pixel of the plurality of pixels 210 to 240 includes four photodiodes PD1 to PD4. However, example embodiments are not limited thereto. For example, according to example embodiments, the number of the photodiodes PD1 to PD4 included in each pixel of the plurality of pixels 210 to 240 may be variously modified.

In a typical case, the read-out circuit of the image sensor may read the pixel voltage from each of the plurality of photodiodes PD1 to PD4 to obtain the pixel signal. For example, an operation of obtaining the pixel signal from the first pixel 210 may include an operation of reading the pixel voltage from each of the first to fourth photodiodes PD1 to PD4 included in the first pixel 210. Thus, to obtain the pixel signal from the first pixel 210, the read-out operation in which the pixel voltage is read may be performed four times, which may lead to an increase in the time and/or the power consumption required for the read-out operation. In addition, since the noise component is included in the pixel voltage for each read-out operation, the image quality may be degraded.

In example embodiments according to the present inventive concept, the read-out circuit may read the pixel voltage corresponding to the charge generated by at least a portion of the plurality of photodiodes PD1 to PD4 included in each pixel of the plurality of pixels 210 to 240 substantially simultaneously. At least a portion of the photodiodes PD1 to PD4 may be connected such that the read-out circuit may read the pixel voltage corresponding to the charge generated by at least a portion of the photodiodes PD1 to PD4 substantially simultaneously.

Figure 6:
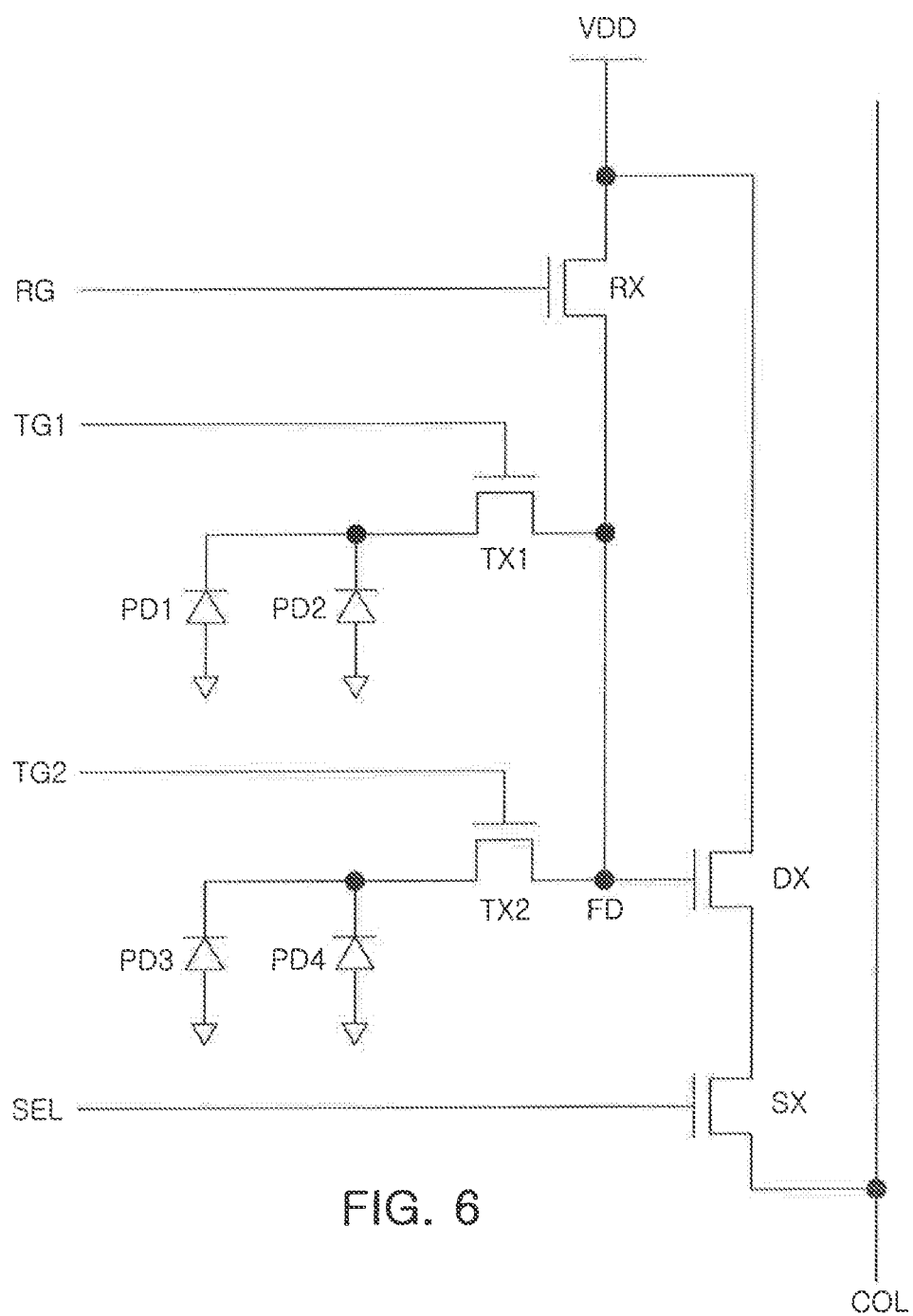
FIGS. 6 and 7 are circuit diagrams illustrating a pixel circuit of an image sensor, according to example embodiments of the present inventive concept.
Figure 7:
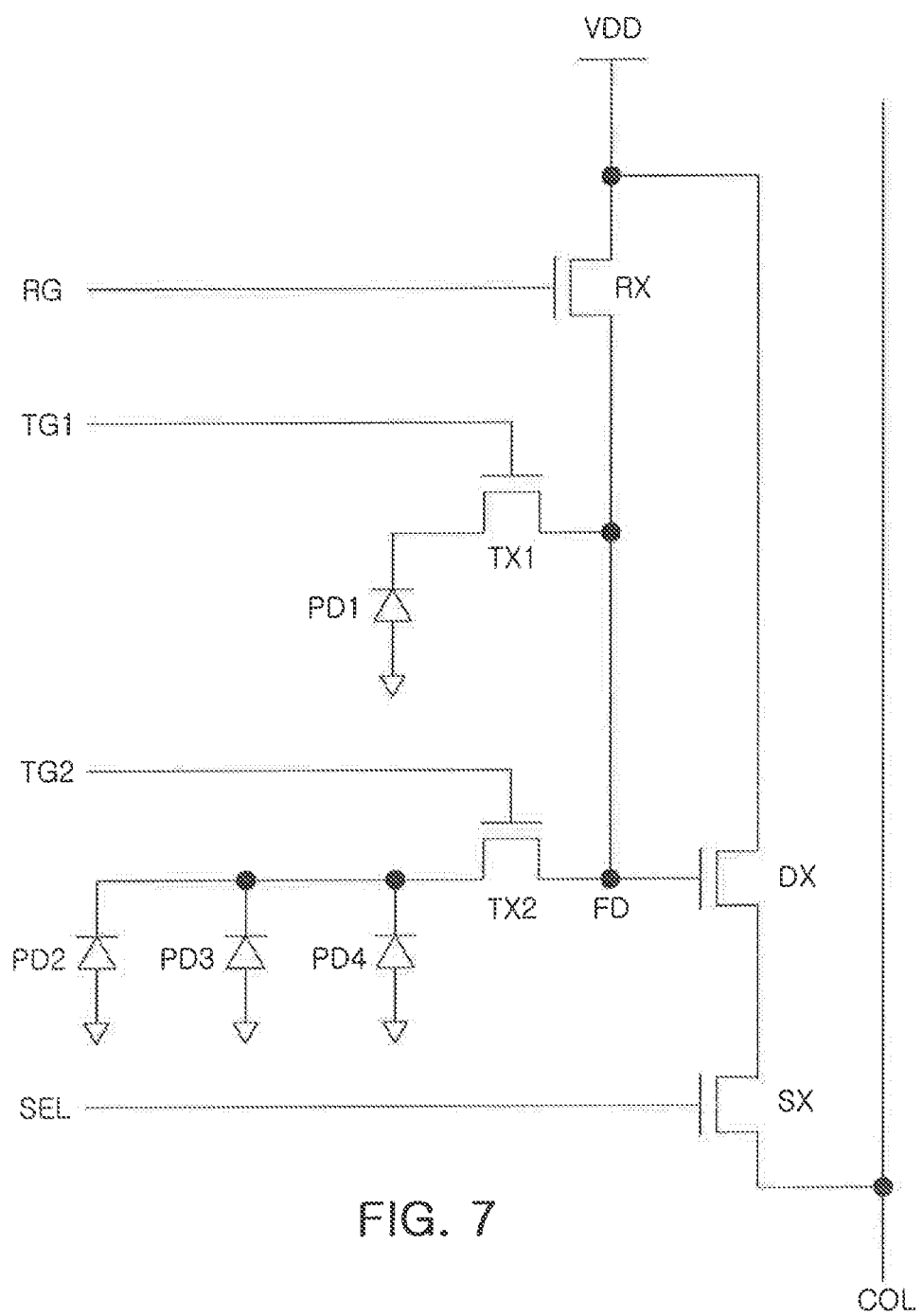

FIGS. 6 and 7 are circuit diagrams illustrating a pixel circuit of an image sensor, according to example embodiments of the present inventive concept. For example, the pixel circuit according to the example embodiments of FIGS. 6 and 7 may be the pixel circuit applied to the image sensor illustrated in FIG. 5.

For convenience of explanation, a duplicative description of elements and technical aspects described with reference to FIG. 6 may be omitted when describing FIG. 7.

First, referring to FIG. 6, a pixel circuit of an image sensor according to an example embodiment of the present inventive concept may include, for example, a reset transistor RX, a driving transistor DX, a selection transistor SX, a first transfer transistor TX1, and a second transfer transistor TX2. The first transfer transistor TX1 may be connected to a first photodiode PD1 and a second photodiode PD2, and the second transfer transistor TX2 may be connected to a third photodiode PD3 and a fourth photodiode PD4.

Hereinafter, an operation of the pixel circuit illustrated in FIG. 6 will be described.

First, when the reset transistor RX is turned on by a reset control signal RG, a floating diffusion region FD may be reset by a power supply voltage VDD. Then, when the selection transistor SX is turned on by a selection control signal SEL, the read-out circuit of the image sensor may detect the reset voltage from the floating diffusion region FD through the corresponding column line COL.

When the operation of detecting the reset voltage is completed, the first transfer transistor TX1 may be turned on. At this time, the second transfer transistor TX2 may be turned off. When the first transfer transistor TX1 is turned on by a first transfer control signal TG1, the charge generated by the first and second photodiodes PD1 and PD2 may be accumulated in the floating diffusion region FD. Then, when the selection transistor SX is turned on, the read-out circuit may detect the first pixel voltage corresponding to the amount of charges generated by the first and second photodiodes PD1 and PD2 through the corresponding column line COL.

When the operation of detecting the first pixel voltage is completed, the second transfer transistor TX2 may be turned on. The second transfer transistor TX2 may be turned on by a second transfer control signal TG2. As the second transfer transistor TX2 is turned on, charges generated by the third and fourth photodiodes PD3 and PD4 may be accumulated in the floating diffusion region FD. At this time, the charges accumulated in the floating diffusion region FD may be charges generated by the first to fourth photodiodes PD1 to PD4. The read-out circuit may detect the pixel voltage corresponding to the total amount of charges generated by the first to fourth photodiodes PD1 to PD4 through the corresponding column line COL.

The control logic of the image sensor may obtain the second pixel voltage corresponding to the amount of charges generated by the third and fourth photodiodes PD3 and PD4 by calculating the difference between the pixel voltage and the first pixel voltage. The control logic may obtain the first pixel signal and the second pixel signal by using the first pixel voltage and the second pixel voltage, and may provide the autofocusing function by using the phase difference between the first pixel signal and the second pixel signal. The control logic may generate the image data by using the pixel signal obtained from the pixel voltage corresponding to the sum of the charges generated by the first to fourth photodiodes PD1 to PD4.

In an example embodiment of the present inventive concept, the read-out circuit does not obtain the pixel voltage from each of the photodiodes PD1 to PD4 through the pixel circuit, and the pixel voltage may be read substantially simultaneously from at least a portion of the photodiodes PD1 to PD4. Therefore, the number of times the read-out operation is performed may be reduced. As a result, the time and/or the power consumption required for the read-out operation may be reduced, and the increase of the noise component due to the increase in the number of times the read-out operation is performed may be significantly reduced. Accordingly, degradation of the image quality may be reduced.

Next, referring to FIG. 7, in an example embodiment, the first transfer transistor TX1 may be connected to the first photodiode PD1, and the second transfer transistor TX2 may be connected to the second to fourth photodiodes PD2 to PD4. When the first transfer transistor TX1 is turned on such that the charge of the first photodiode PD1 is accumulated in the floating diffusion region FD, the read-out circuit may detect the first pixel voltage corresponding to the charge of the first photodiode PD1. Next, when the second transfer transistor TX2 is turned on such that the charges of the second to fourth photodiodes PD2 to PD4 move to the floating diffusion region FD, the read-out circuit may detect the pixel voltage corresponding to the sum of the charges generated by the first to fourth photodiodes PD1 to PD4.

The control logic may obtain the second pixel voltage corresponding to the sum of the charges generated by the second to fourth photodiodes PD2 to PD4 by calculating the difference between the pixel voltage and the first pixel voltage. The control logic may provide an autofocusing function using the phase difference between the first pixel signal and the second pixel signal generated from the first pixel voltage and the second pixel voltage, respectively. In addition, the image data may be generated by using the pixel signal generated from the pixel voltage.

In each of the example embodiments illustrated in FIGS. 6 and 7, the autofocusing function may be provided in different directions. For example, in the example embodiment illustrated in FIG. 6, the pixel voltage may be detected substantially simultaneously from the charges of the first and second photodiodes PD1 and PD2, and the pixel voltage may be detected substantially simultaneously from the charges of the third and fourth photodiodes PD3 and PD4. Therefore, assuming that the pixel circuit of FIG. 6 is applied to the pixel array 200 of FIG. 5, the pixel circuit of FIG. 6 may generate information necessary for focusing in the second direction (Y-axis direction). Similarly, the pixel circuit of FIG. 7 may provide information necessary for focusing in a direction which is rotated by about 45 degrees counterclockwise based on the second direction (Y-axis direction).

FIGS. 8 to 12 are diagrams illustrating a pixel structure of an image sensor, according to an example embodiment of the present inventive concept.

Figure 8:
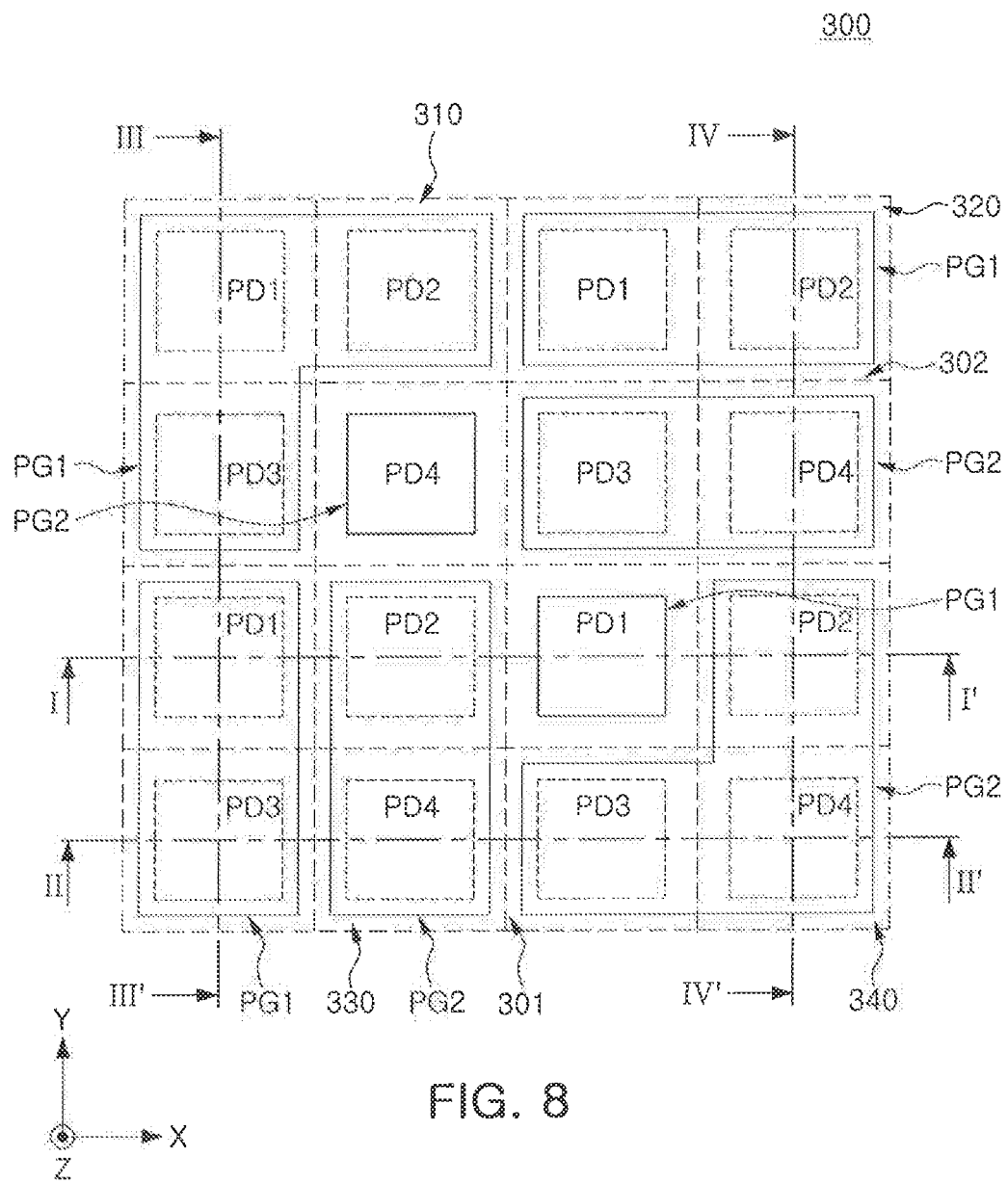
FIGS. 8 to 12 are diagrams illustrating a pixel structure of an image sensor, according to an example embodiment of the present inventive concept.

Referring to FIG. 8, a pixel array 300 of an image sensor according to an example embodiment of the present inventive concept may include a plurality of pixels 310, 320, 330 and 340. It should be understood that, for convenience of illustration, FIG. 8 illustrates only a partial area of the pixel array 300.

Each pixel of the plurality of pixels 310 to 340 may include first to fourth photodiodes PD1, PD2, PD3 and PD4. The first to fourth photodiodes PD1 to PD4 may be arranged in the first direction (X-axis direction) and the second direction (Y-axis direction), and may be located at substantially the same level in a third direction (Z-axis direction). A first device isolation film 301 may be disposed between the plurality of pixels 310 to 340, and a second device isolation film 302 may be disposed for each pixel of the plurality of pixels 310 to 340. A plurality of unit areas in which the first to fourth photodiodes PD1 to PD4 are formed in each pixel of the plurality of pixels 310 to 340 may be defined by the second device isolation film 302.

In the example embodiment illustrated in FIG. 8, at least a portion of the first to fourth photodiodes PD1 to PD4 in each pixel of the plurality of pixels 310 to 340 may be physically connected to each other. For example, in the case of the first pixel 310, the first to third photodiodes PD1 to PD3 may be physically connected to each other to form a first photodiode group PG1. The fourth photodiode PD4 of the first pixel 310 may independently provide a second photodiode group PG2. In the second pixel 320, the first and second photodiodes PD1 and PD2 may be physically connected to each other to provide the first photodiode group PG1, and the third and fourth photodiodes PD3 and PD4 may be physically connected to each other to provide the second photodiode group PG2.

The first photodiode group PG1 of the third pixel 330 may include first and third photodiodes PD1 and PD3 physically connected to each other, and the second photodiode group PG2 may include second and fourth photodiodes PD2 and PD4 physically connected to each other. In the case of the fourth pixel 340, the first photodiode PD1 may independently provide the first photodiode group PG1, and the second to fourth photodiodes PD2 to PD4 physically connected to each other may provide the second photodiode group PG2.

In the above description, an expression of being physically connected may be interpreted to mean that two or more of the first to fourth photodiodes PD1 to PD4 are directly connected through a device connection layer. For example, in an example embodiment, in the case of the first pixel 310, the first to third photodiodes PD1 to PD3 may be commonly connected to the device connection layer to form the first photodiode group PG1. In an example embodiment of the present inventive concept, the device connection layer that provides the first photodiode group PG1 or the second photodiode group PG2 may have different shapes, areas, etc. in the pixels 310 to 340 adjacent to each other. For example, the shape, the area, the number, etc. of each of the device connection layers of the first pixel 310 and the second pixel 320 may be different from each other.

For example, according to example embodiments, a device connection layer disposed at a lower portion of the plurality of photodiodes PD1 to PD4 may separate the plurality of photodiodes PD1 to PD4 into a first photodiode group PG1 and a second photodiode group PG2 by connecting at least portions of the plurality of photodiodes PD1 to PD4 to each other.

At least a portion of the first to fourth photodiodes PD1 to PD4 may be connected to each other through the device connection layer such that the pixel circuit may read the pixel voltage substantially simultaneously from the two or more photodiodes PD1 to PD4 connected to the device connection layer. Accordingly, the number of read-out operations performed to read the pixel voltage from each pixel of the plurality of pixels 310 to 340 may be reduced, thereby reducing the required time and the power consumption of the read-out operation according to example embodiments. As a result, the noise increase due to the increase in the number of times the read-out operation is performed may be significantly reduced according to example embodiments. In addition, the transfer transistor may be connected in a one-by-one manner to each of the first photodiode group PG1 and the second photodiode group PG2. For example, the number of the photodiodes PD1 to PD4 in each pixel of the plurality of pixels 310 to 340 may be greater than the number of the transfer transistors.

Figure 9:
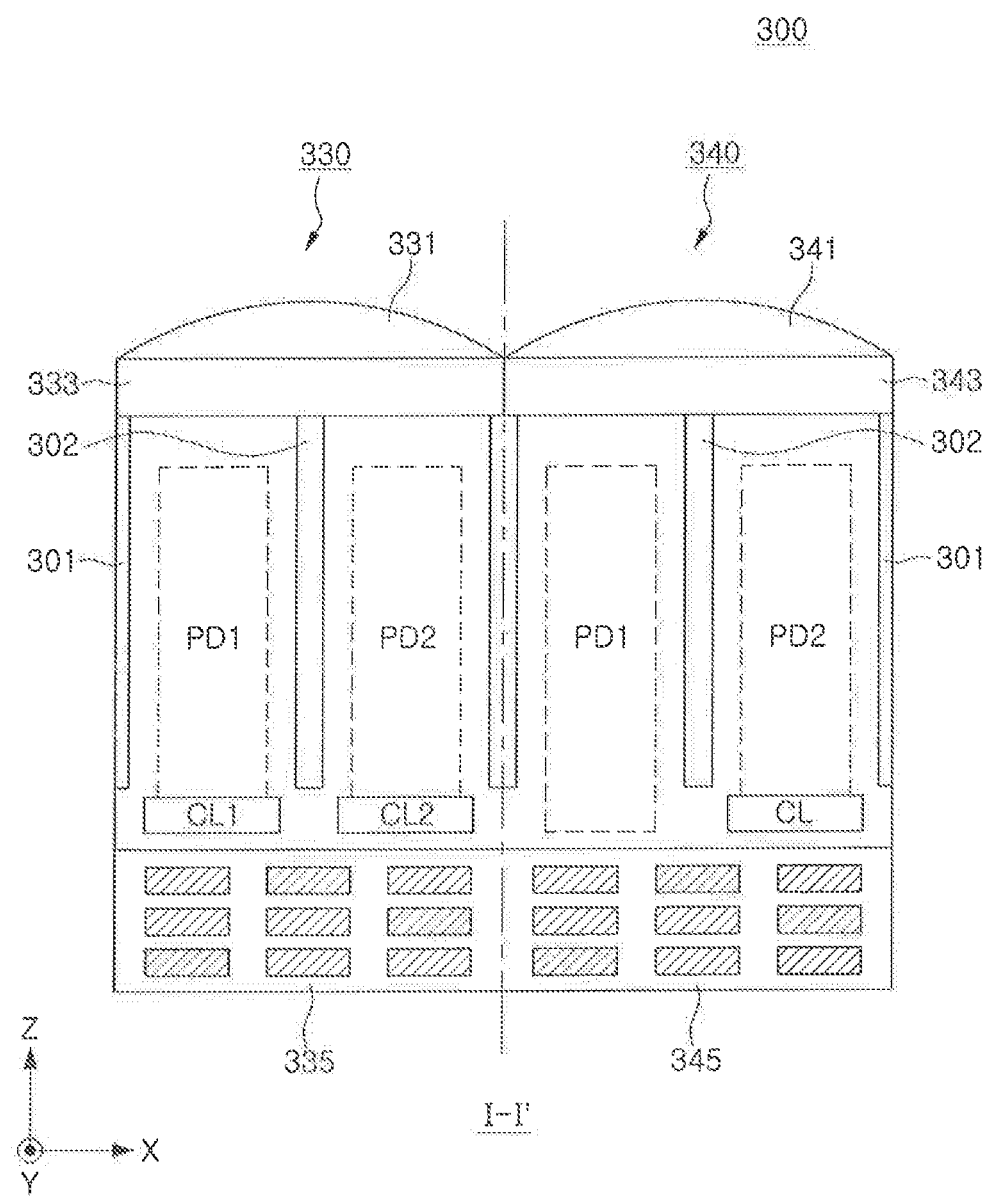
Figure 10:
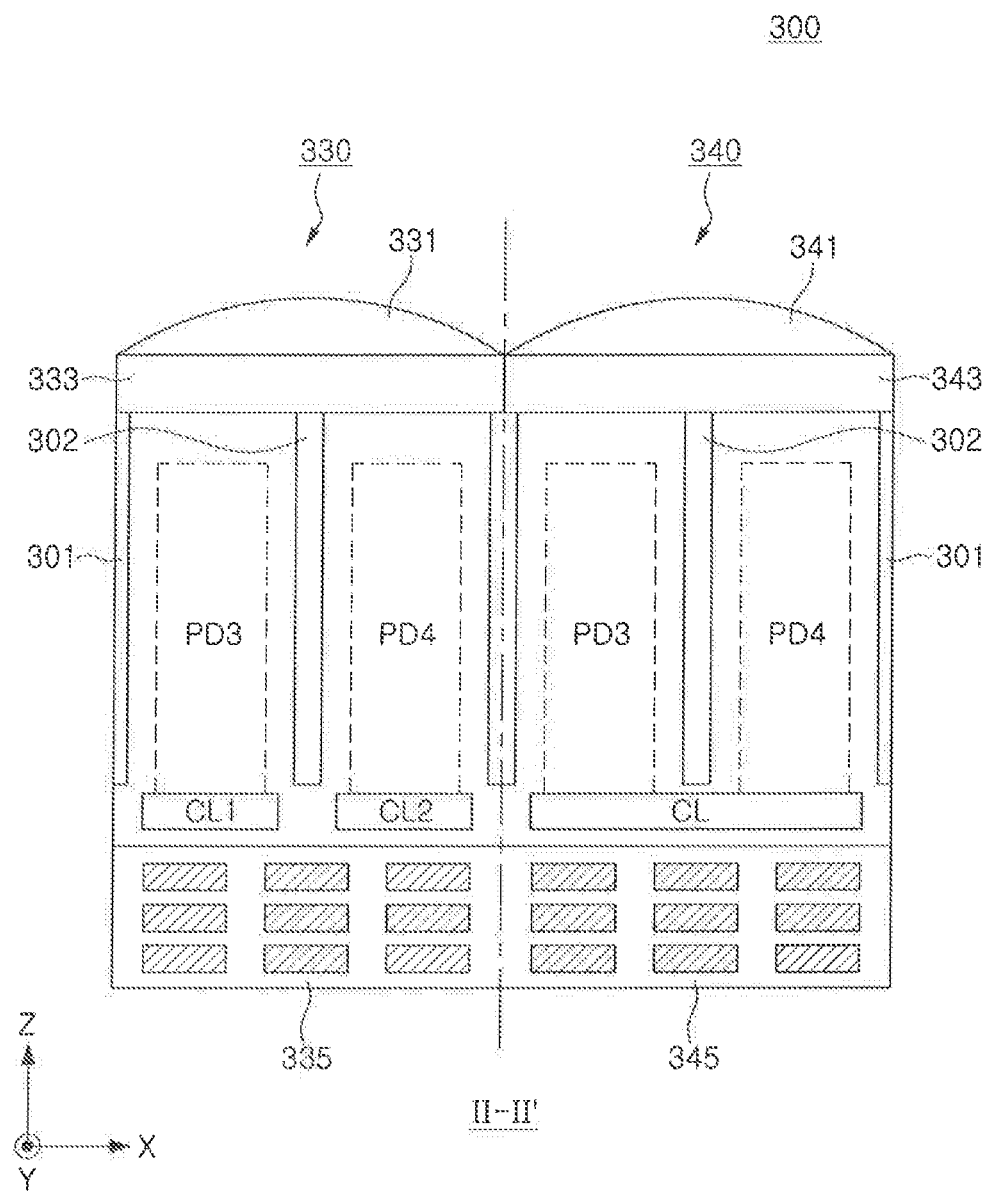

FIGS. 9 and 10 are cross-sectional views of the pixel array 300 illustrated in FIG. 8 taken along lines I-I' and II-II', respectively. Referring to FIGS. 9 and 10, the third pixel 330 and the fourth pixel 340 may be separated from each other by the first device isolation film 301, and the second device isolation film 302 may be formed inside of each of the third pixel 330 and the fourth pixel 340. Each of the third pixel 330 and the fourth pixel 340 may have a plurality of unit areas defined by the second device isolation film 302, and the plurality of photodiodes PD1 to PD4 may be formed in the plurality of unit areas.

The third pixel 330 and the fourth pixel 340 may include microlenses 331 and 341, color filters 333 and 343, and pixel circuits 335 and 345. In each of the third pixel 330 and the fourth pixel 340 disposed adjacent to each other, the color filters 333 and 343 may transfer different colors of light. For example, the color filter 333 of the third pixel 330 may be a green color filter that transfers green light, and the color filter 343 of the fourth pixel 340 may be a red color filter that transfers red light. The pixel circuits 335 and 345 may include, for example, a driving transistor, a reset transistor, a selection transistor, a transfer transistor, etc.

In the third pixel 330, the first and third photodiodes PD1 and PD3 may be connected to each other by the first device connection layer CL1 to provide the first photodiode group PG1, and the second and fourth photodiodes PD2 and PD4 may be connected to each other by the second device connection layer CL2 to provide the second photodiode group PG2. In the fourth pixel 340, the second to fourth photodiodes PD2 to PD4 may be connected to each other by one device connection layer CL to provide the second photodiode group PG2.

As illustrated in FIGS. 9 and 10, the device connection layers CL1, CL2, and CL may be disposed between the photodiodes PD1 to PD4 and the pixel circuits 335 and 345. Further, in an example embodiment, the device isolation films 301 and 302 are not connected to all of the color filters 333 and 343 and the pixel circuits 335 and 345. The device connection layers CL1, CL2 and CL may be formed in areas in which the device isolation films 301 and 302 are not formed. For example, the device connection layers CL1, CL2, and CL may be doped with impurities to physically connect some of the photodiodes PD1 to PD4 and to be electrically connected to the floating diffusion region of the pixel circuits 335 and 345. In an example embodiment, the device connection layers CL1, CL2, and CL may be doped with an N-type impurity.

Figure 11:
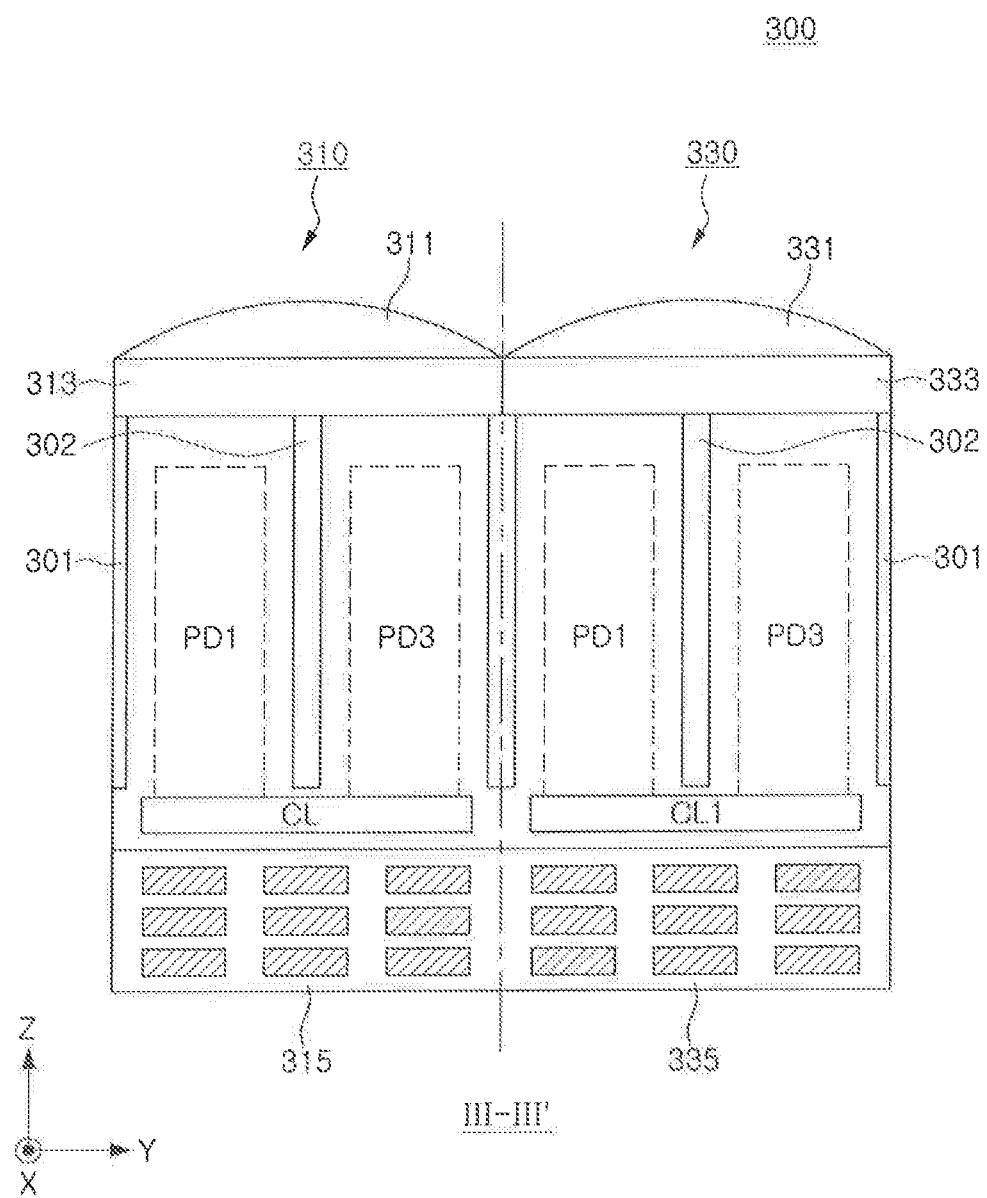

FIG. 11 is a cross-sectional view of the pixel array 300 illustrated in FIG. 8 taken along line III-III'. Referring to FIG. 11, the first pixel 310 and the third pixel 330 may be separated from each other by the first isolation film 301, and the second device isolation film 302 may be formed inside of each of the third pixel 330 and the fourth pixel 340. The depths of the first device isolation film 301 and the second device isolation film 302 in the third direction (Z-axis direction) may be smaller than the depth of the semiconductor substrate in which the photodiodes PD1 to PD4 are formed. The first pixel 310 may include a microlens 311 and a color filter 313.

In the first pixel 310, the first to third photodiodes PD1 to PD3 may be connected by the device connection layer CL. The first to third photodiodes PD1 to PD3 connected by the device connection layer CL may provide the first photodiode group PG1, and the fourth photodiode PD4 may independently provide the second photodiode group PG2. A pixel circuit 315 of the first pixel 310 may obtain a first pixel voltage corresponding to the sum of charges generated in the first to third photodiodes PD1 to PD3 through the device connection layer CL substantially simultaneously. Thus, by reducing the number of read-out operations for obtaining the pixel voltage, the operating speed, the power consumption, and/or the noise characteristic of the image sensor may be improved.

Figure 12:
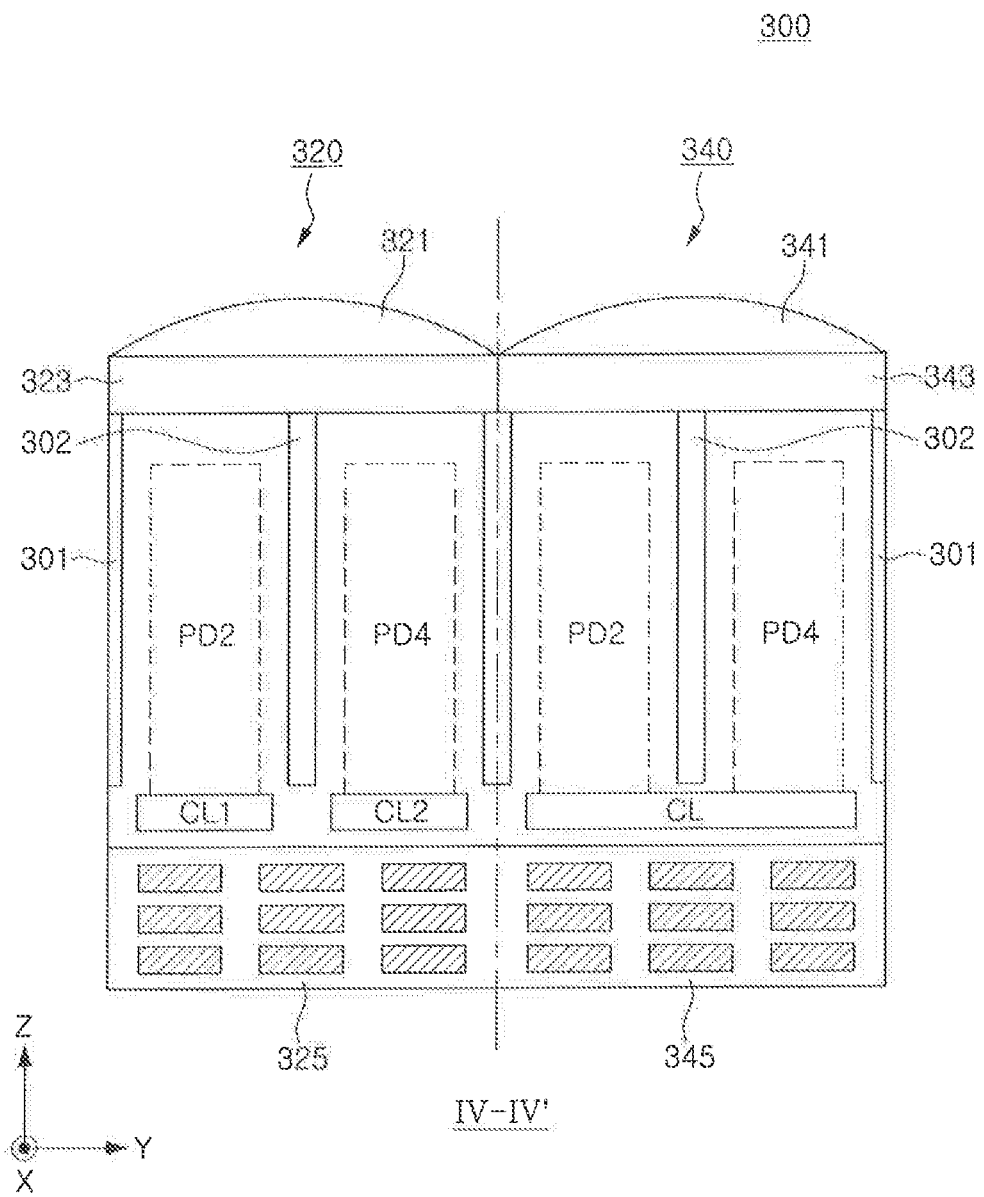

FIG. 12 is a cross-sectional view of the pixel array 300 illustrated in FIG. 8 taken along line IV-IV'. Referring to FIG. 12, the second pixel 320 and the fourth pixel 340 may be separated from each other by the first device isolation film 301, and the second device isolation film 302 may be formed inside of each of the second pixel 320 and the fourth pixel 340. The second pixel 320 may include a microlens 321, a color filter 323, and a pixel circuit 325. The device connection layers CL1, CL2, and CL may be disposed between the device isolation films 301 and 302 and the pixel circuits 325 and 345 in the third direction (Z-axis direction).

The second pixel 320 may include a first photodiode group PG1 having a first device connection layer CL1 and first and second photodiodes PD1 and PD2, and a second photodiode group PG2 having a second device connection layer CL2 and third and fourth photodiodes PD3 and PD4. In the fourth pixel 340, the second to fourth photodiodes PD2 to PD4 may be physically connected to each other by one device connection layer CL to provide the second photodiode group PG2.

An image sensor may provide an autofocusing function using a phase difference of the pixel signals obtained from the photodiode groups PG1 and PG2 of each of the pixels 310 to 340. In an example embodiment described with reference to FIGS. 8 to 12, the photodiode groups PG1 and PG2 may have different shapes and/or areas in at least a portion of the pixels 310 to 340 adjacent to each other. Accordingly, since at least a portion of the pixels 310 to 340 adjacent to each other provide information necessary for focusing in different directions, the performance of the image sensor may be improved by providing an autofocusing function in various directions. In addition, by bundling at least a portion of the photodiodes PD1 to PD4 included in each of the pixels 310 to 340 into the photodiode groups PG1 and PG2, the power consumption and the time required for the read-out operation, and a noise generated in the read-out operation, may be reduced according to example embodiments of the present inventive concept.

Figure 13:
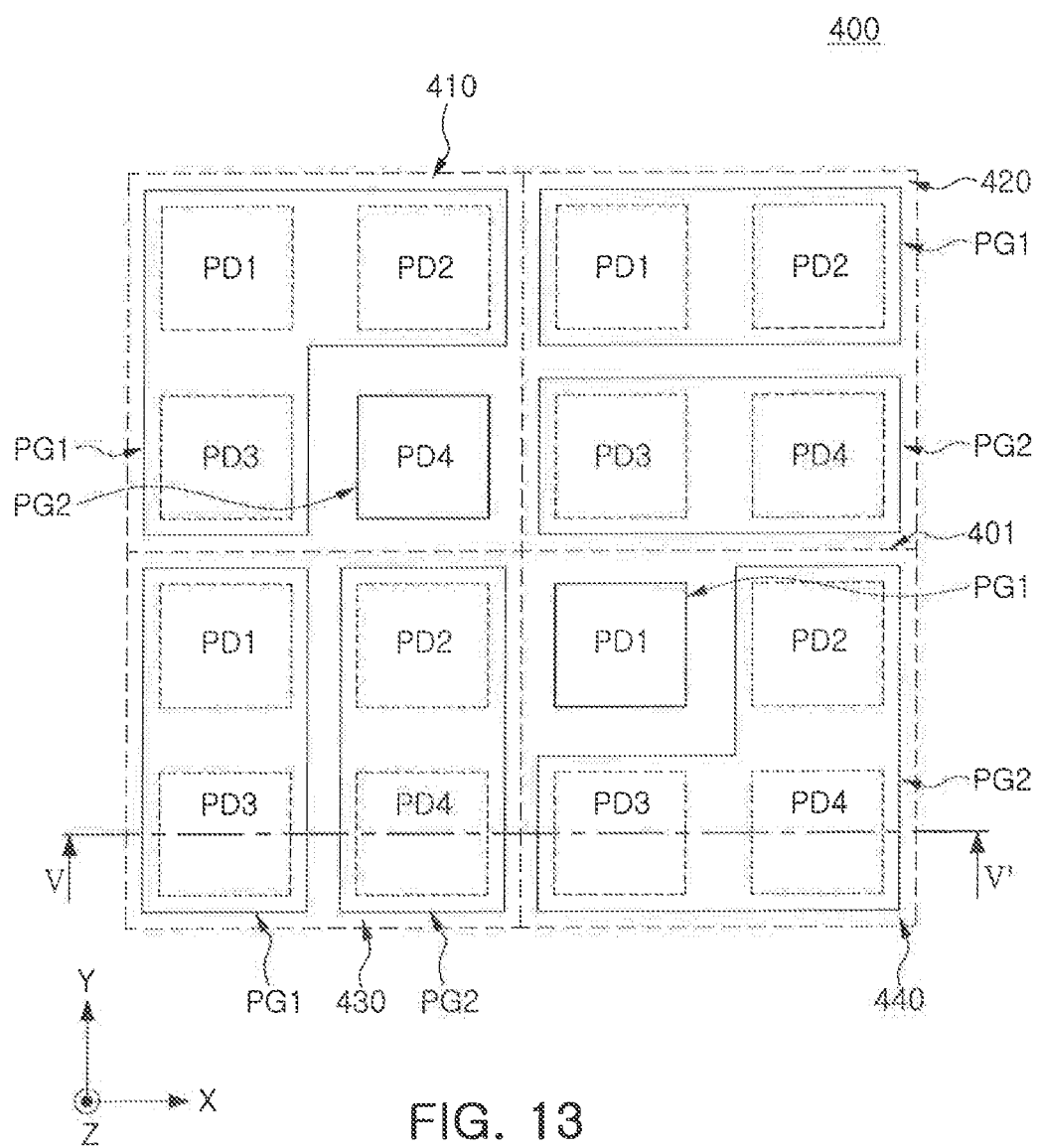
FIGS. 13 and 14 are diagrams illustrating a pixel structure of an image sensor, according to an example embodiment of the present inventive concept.
Figure 14:
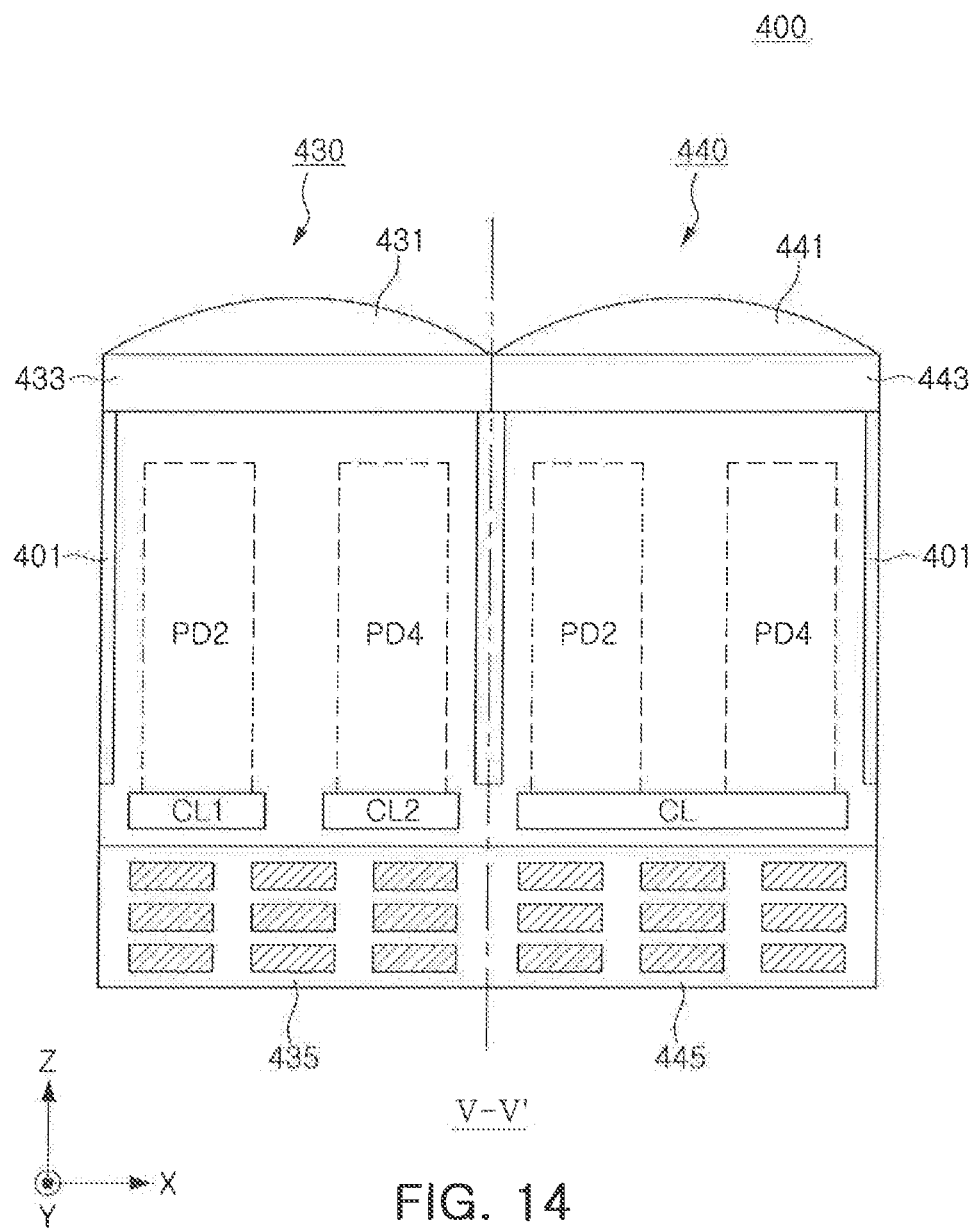

FIGS. 13 and 14 are diagrams illustrating a pixel structure of an image sensor, according to an example embodiment of the present inventive concept.

FIG. 13 is a plan diagram illustrating a partial area of a pixel array 400 of an image sensor according to an example embodiment of the present inventive concept. FIG. 14 is a cross-sectional view of the pixel array 400 illustrated in FIG. 13 taken along line V-V'.

Referring to FIGS. 13 and 14, a plurality of pixels 410, 420, 430 and 440 may be separated from each other by a device isolation film 401. Each pixel of the plurality of pixels 410 to 440 may include the first to fourth photodiodes PD1 to PD4. In each pixel of the plurality of pixels 410 to 440, at least a portion of the first to fourth photodiodes PD1 to PD4 may be connected to each other to provide the first photodiode group PG1 or the second photodiode group PG2. The photodiode groups PG1 and PG2 may be defined by the device connection layers CL1, CL2, and CL connecting at least a portion of the first to fourth photodiodes PD1 to PD4. The third pixel 430 may include a microlens 431, a color filter 433, and a pixel circuit 435. The fourth pixel 440 may include a microlens 441, a color filter 443, and a pixel circuit 445.

In the example embodiment illustrated in FIGS. 13 and 14, the device isolation film 401 may only be formed at a boundary between the plurality of pixels 410 to 440, and the device isolation film 401 is not formed inside of each pixel of the plurality of pixels 410 to 440. In addition, referring to FIG. 14, the device connection layers CL1, CL2, and CL may be disposed between the pixel circuits 435 and 445 and the color filters 433 and 443 to physically connect at least a portion of the first to fourth photodiodes PD1 to PD4 to each other.

The device connection layers CL1, CL2, and CL may be doped with an N-type impurity, and the device connection layers CL1, CL2, and CL included in the plurality of pixels 410 to 440 adjacent to each other may have different shapes or areas. For example, the device connection layer CL formed in the fourth pixel 440 may have a larger area than the first and second device connection layers CL1 and CL2 formed in the third pixel 430.

Light receiving areas of the photodiode groups PG1 and PG2 included in the plurality of pixels 410 to 440 may be determined by the device connection layers CL1, CL2, and CL. For example, in an example embodiment, the photodiode groups PG1 and PG2 of the third pixel 430 may have different light receiving areas from the photodiode groups PG1 and PG2 of the fourth pixel 440. In contrast, in an example embodiment, the photodiode groups PG1 and PG2 of the third pixel 430 may have substantially the same light receiving area as the photodiode groups PG1 and PG2 of the second pixel 420.

Figure 15:
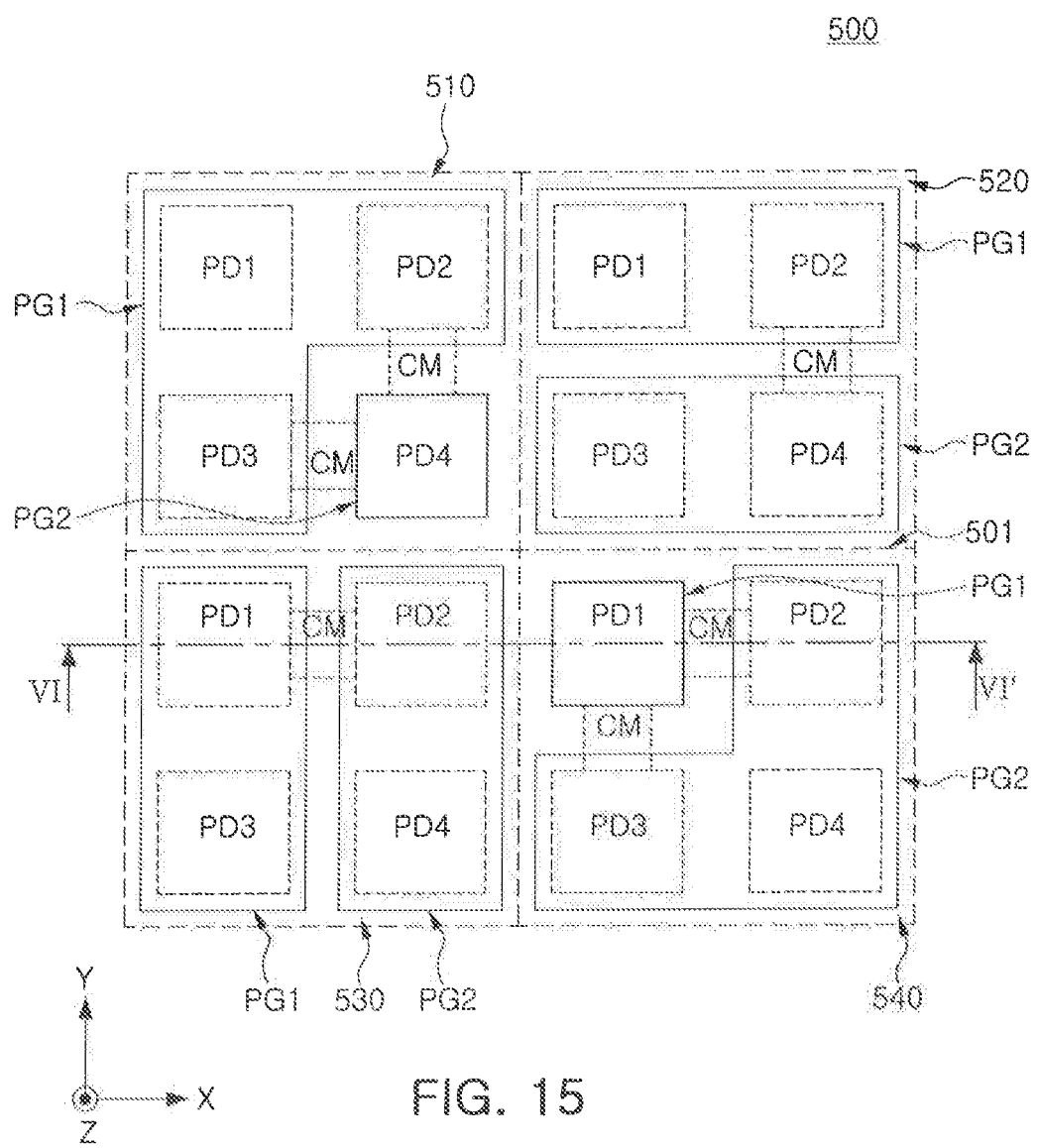
FIGS. 15 and 16 are diagrams illustrating a pixel structure of an image sensor, according to an example embodiment of the present inventive concept.
Figure 16:
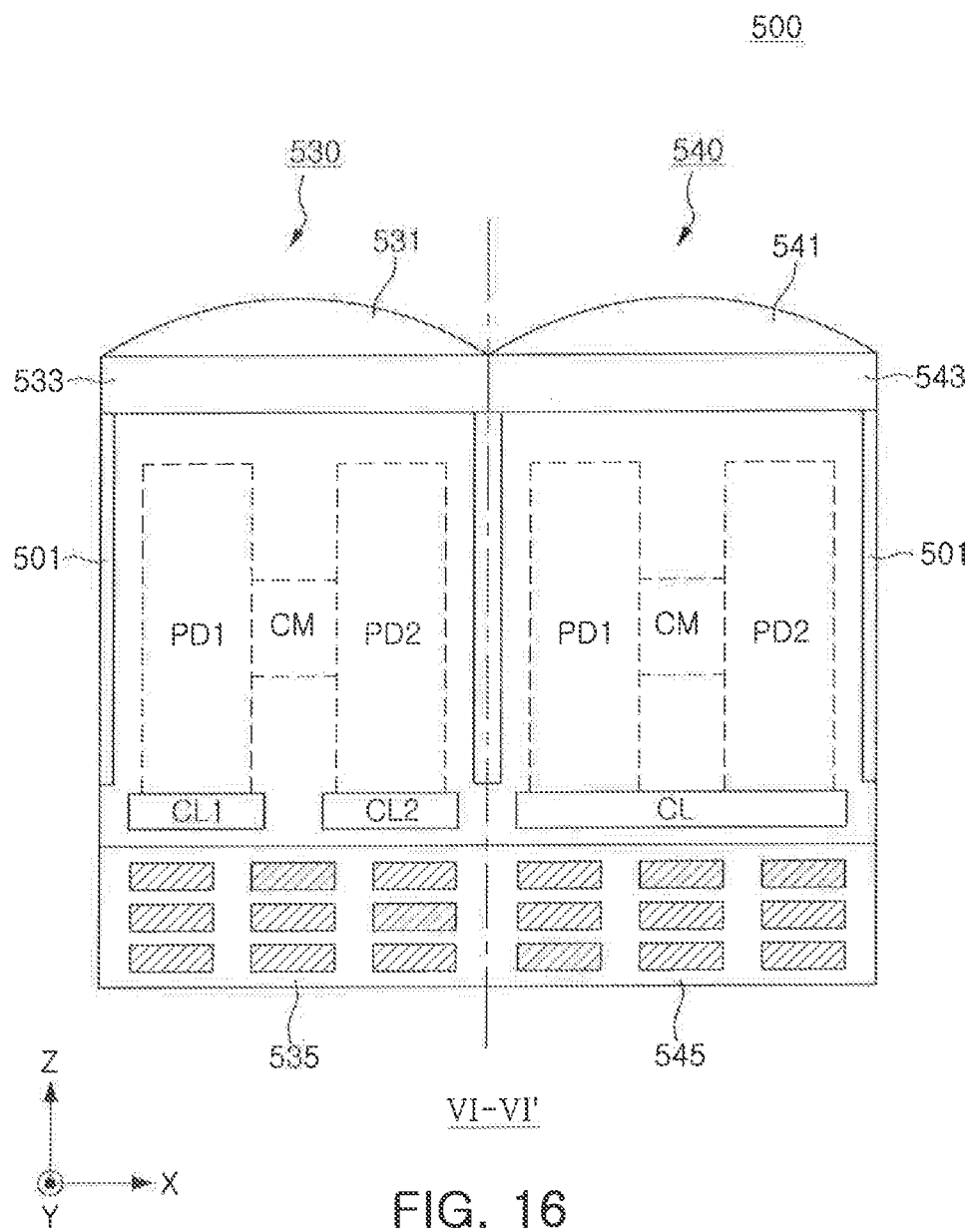

FIGS. 15 and 16 are diagrams illustrating a pixel structure of an image sensor, according to an example embodiment of the present inventive concept.

FIG. 15 is a plan diagram illustrating a partial area of a pixel array 500 of an image sensor, according to an example embodiment of the present inventive concept. FIG. 16 is a cross-sectional view of the pixel array 500 illustrated in FIG. 15 taken along line VI-VI'.

The pixel array 500 may include a plurality of pixels 510, 520, 530 and 540 separated by a device isolation film 501. A plurality of photodiodes PD1 to PD4 may be disposed along a first direction (X-axis direction) and a second direction (Y-axis direction) in each pixel of the plurality of pixels 510 to 540. At least a portion of the plurality of photodiodes PD1 to PD4 in each pixel of the plurality of pixels 510 to 540 may be connected to each other by the device connection layers CL1, CL2, and CL to provide the photodiode groups PG1 and PG2. Referring to FIG. 16, the third pixel 530 may include a microlens 531, a color filter 533, and a pixel circuit 535. The fourth pixel 540 may include a microlens 541, a color filter 543, and a pixel circuit 545. The device connection layers CL1, CL2, and CL may be disposed between the pixel circuits 535 and 545 and the color filters 533 and 543. The microlenses 531 and 541 may be formed in an upper portion of the color filters 533 and 543.

In the example embodiment illustrated in FIGS. 15 and 16, a charge transfer layer CM connecting the photodiodes PD1 to PD4 to each other may be formed. For example, in the third pixel 530, when light is excessively introduced into the first photodiode PD1 to be saturated, some charges generated in the first photodiode PD1 may be transferred to the second photodiode PD2 through the charge transfer layer CM. Therefore, the saturation of the photodiodes PD1 to PD4 may be prevented or reduced by the charge transfer layer CM. The charge transfer layer CM may be connected between the different photodiode groups PG1 and PG2, or may also be connected between the photodiodes PD1 to PD4 belonging to the same photodiode groups PG1 and PG2 according to an example embodiment. As illustrated in FIG. 16, the charge transfer layer CM may be positioned between the device connection layers CL1, CL2, and CL and the color filters 533 and 543 in the third direction (Z-axis direction).

Figure 17:
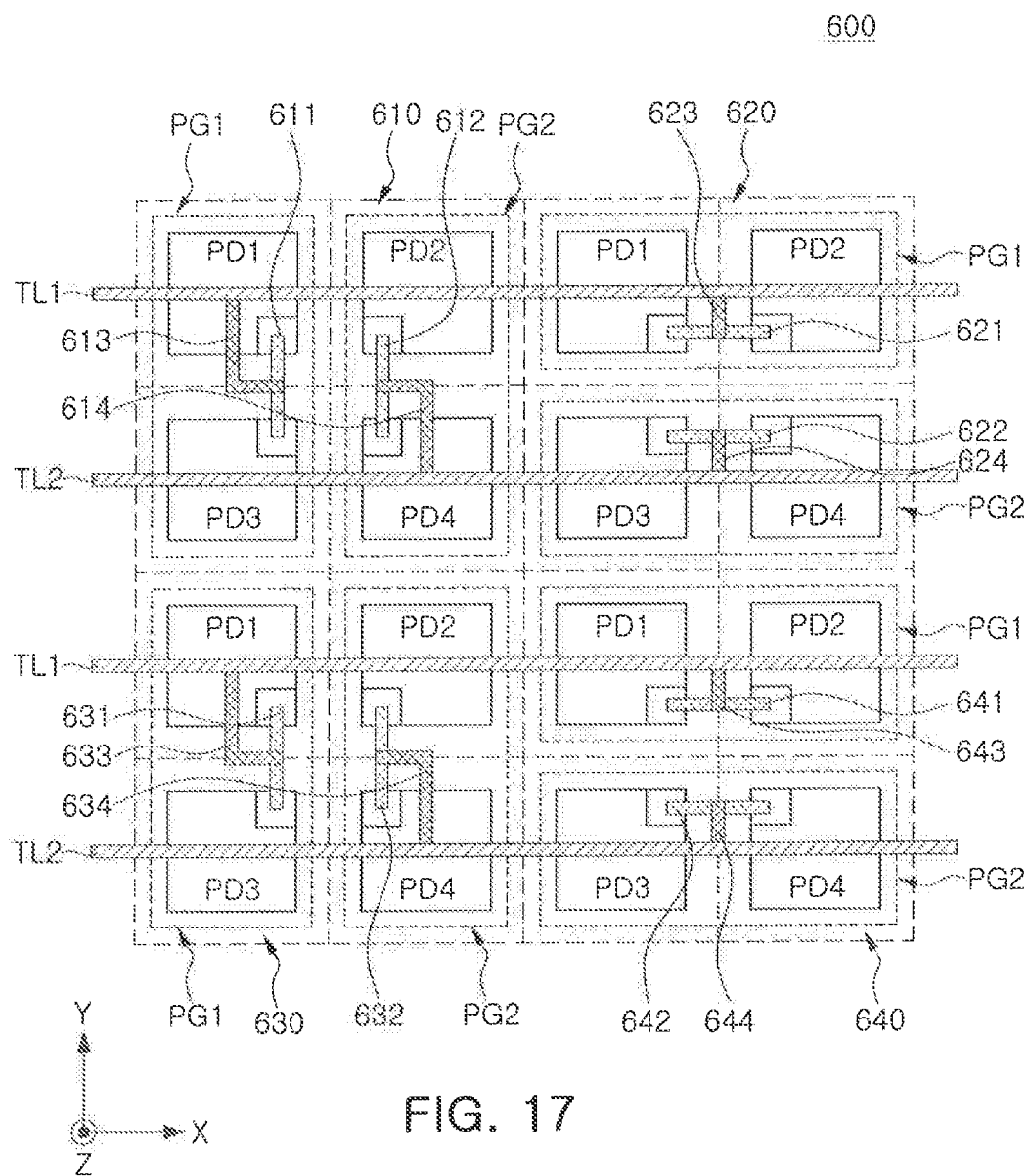
FIG. 17 is a diagram illustrating an image sensor, according to an example embodiment of the present inventive concept.

FIG. 17 is a diagram illustrating an image sensor, according to an example embodiment of the present inventive concept.

FIG. 17 is a plan diagram illustrating a partial area of a pixel array 600 of an image sensor, according to an example embodiment of the present inventive concept. Referring to FIG. 17, the pixel array 600 may include a plurality of pixels 610, 620, 630 and 640 arranged in a first direction (X-axis direction) and a second direction (Y-axis direction). Each pixel of the plurality of pixels 610 to 640 may include the plurality of photodiodes PD1 to PD4. The number of the plurality of photodiodes PD1 to PD4 included in each pixel of the plurality of pixels 610 to 640 may be variously modified.

In the example embodiment illustrated in FIG. 17, each pixel of the plurality of pixels 610 to 640 may include transfer transistors connected to the plurality of photodiodes PD1 to PD4. In each pixel of the plurality of pixels 610 to 640, the number of the photodiodes PD1 to PD4 and the number of the transfer transistors may be equal to each other. In addition, in each pixel of the plurality of pixels 610 to 640, at least a portion of gate electrode layers of the transfer transistors may be connected to each other by connection lines 611, 612, 621, 622, 631, 632, 641, and 642.

For example, referring to the first pixel 610, the gate electrode layers of the transfer transistors connected to the first photodiode PD1 and the third photodiode PD3 may be connected to each other by a first connection line 611. The first connection line 611 may be connected to a first transmission control line TL1 through an intermediate line 613. The gate electrode layers of the transfer transistors connected to the second photodiode PD2 and the fourth photodiode PD4 in the first pixel 610 may be connected to each other by a second connection line 612. The second connection line 612 may be connected to a second transmission control line TL2 through an intermediate line 614.

Therefore, charges generated in the first photodiode PD1 and the third photodiode PD3 may be moved together to a floating diffusion region by the transfer control signal transmitted through the first transfer control line TL1. In addition, charges generated in the second photodiode PD2 and the fourth photodiode PD4 may be moved together to a floating diffusion region by the transfer control signal transmitted through the second transfer control line TL2. For example, the first and third photodiodes PD1 and PD3 may operate as the first photodiode group PG1, and the second and fourth photodiodes PD2 and PD4 may operate as the second photodiode group PG2.

Next, referring to a second pixel 620, the gate electrode layers of the transfer transistors connected to the first photodiode PD1 and the second photodiode PD2 may be connected to each other by the first connection line 621. The first connection line 621 may be connected to the first transfer control line TL1 through an intermediate line 623. The gate electrode layers of the transfer transistors connected to the third photodiode PD3 and the fourth photodiode PD4 in the second pixel 620 may be connected to each other by a second connection line 622. The second connection line 622 may be connected to the second transfer control line TL2 through an intermediate line 624.

According to example embodiments, at least some of the connection lines 611, 612, 621, 622, 631, 632, 641, and 642 may separate the plurality of photodiodes PD1 to PD4 into first and second photodiode groups PG1 and PG2 by connecting at least a portion of gate electrode layers of the plurality of transfer transistors to each other.

The charges generated in the first photodiode PD1 and the second photodiode PD2 of the second pixel 620 may be moved together to the floating diffusion region by the transfer control signal transmitted through the first transfer control line TL1. In addition, the charges generated in the third photodiode PD3 and the fourth photodiode PD4 of the second pixel 620 may be moved together to the floating diffusion region by the transfer control signal transmitted through the second transfer control line TL2. For example, the first and second photodiodes PD1 and PD2 may operate as the first photodiode group PG1, and the third and fourth photodiodes PD3 and PD4 may operate as the second photodiode group PG2.

In an example embodiment, the third pixel 630 may have a structure similar to the first pixel 610, and the fourth pixel

640 may have a structure similar to the second pixel 620. Alternatively, in an example embodiment, the third pixel 630 may have a structure similar to the second pixel 620, and the fourth pixel 640 may have a structure similar to the first pixel 610.

Referring to the first pixel 610 and the second pixel 620, the first transfer line TL1 may be connected to the first photodiode group PG1, and the second transfer line TL2 may be connected to the second photodiode group PG2. Accordingly, the first photodiode groups PG1 of the first pixel 610 and the second pixel 620 may be substantially simultaneously activated through the first transfer line TL1, and the second photodiode groups PG2 of the first pixel 610 and the second pixel 620 may be substantially simultaneously activated through the second transfer line TL2.

Referring to the third pixel 630, the connection line 631 may be connected to a first transmission control line TL1 through an intermediate line 633, and the connection line 632 may be connected to a second transmission control line TL2 through an intermediate line 634.

Referring to the fourth pixel 640, the connection line 641 may be connected to a first transmission control line TL1 through an intermediate line 643, and the connection line 642 may be connected to a second transmission control line TL2 through an intermediate line 644.

Hereinafter, an operation of an image sensor will be described in more detail with reference to FIGS. 18 and 19.

Figure 18:
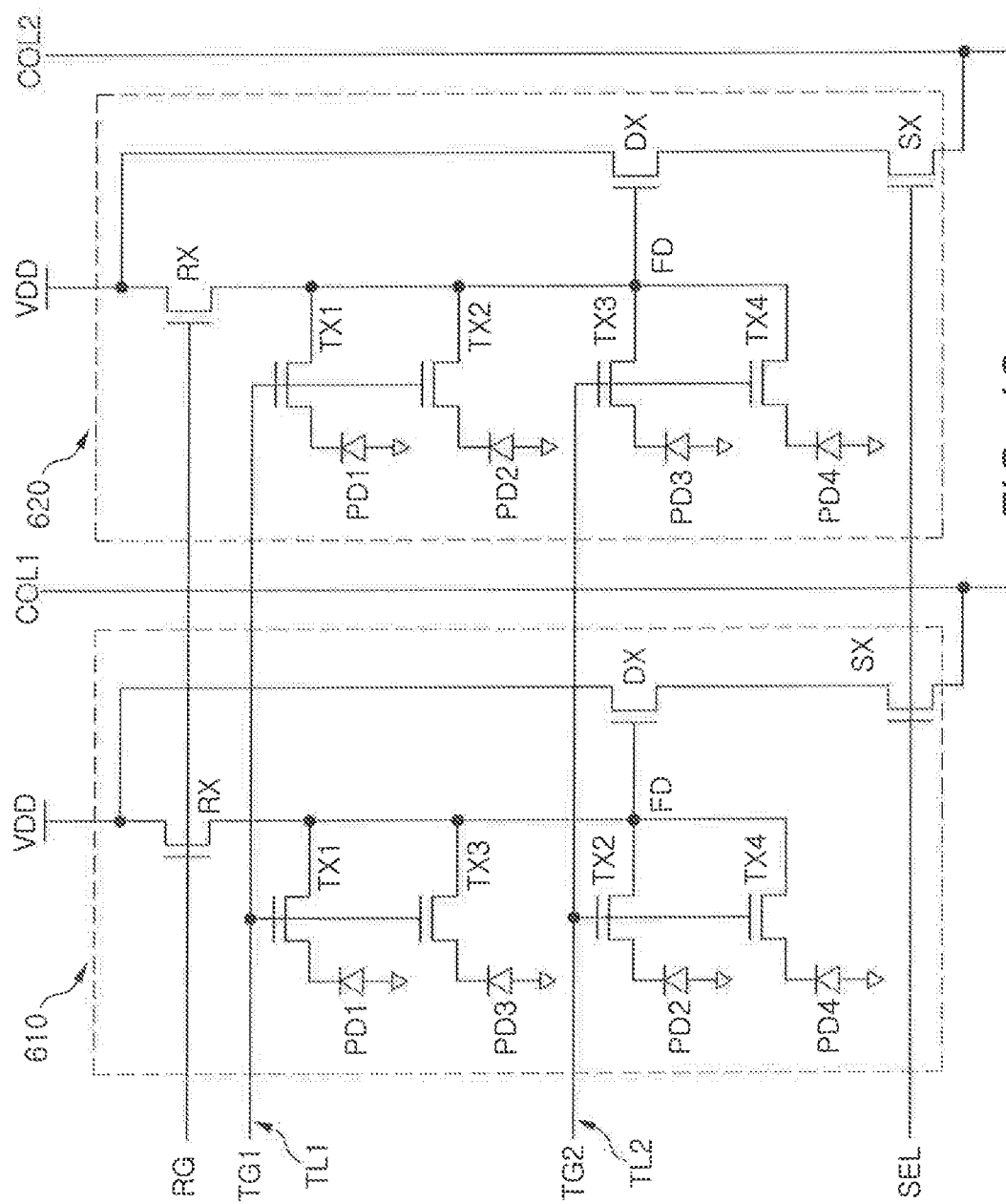
FIG. 18 is a circuit diagram illustrating a pixel circuit of an image sensor, according to an example embodiment of the present inventive concept.

FIG. 18 is a circuit diagram illustrating a pixel circuit of an image sensor, according to an example embodiment of the present inventive concept. FIG. 19 is a timing diagram illustrating an operation of an image sensor, according to an example embodiment of the present inventive concept.

FIG. 18 is a circuit diagram illustrating the pixel circuits of the first pixel 610 and the second pixel 620 of the pixel array 600 illustrated in FIG. 17. Referring to FIG. 18, each of the first pixel 610 and the second pixel 620 may include first to fourth photodiodes PD1 to PD4, first to fourth transfer transistors TX1 to TX4, a reset transistor RX, a driving transistor DX, and a selection transistor SX. The selection transistor SX of the first pixel 610 may be connected to a first column line COL1, and the selection transistor SX of the second pixel 620 may be connected to a second column line COL2.

The reset transistor RX of the first pixel 610 and the second pixel 620 may be controlled by a reset control signal RG, and the selection transistor SX of the first pixel 610 and the second pixel 620 may be controlled by a selection control signal SEL. The first and third transfer transistors TX1 and TX3 of the first pixel 610 and the first and second transfer transistors TX1 and TX2 of the second pixel 620 may be controlled by the first transfer control signal TG1 transmitted through the first transfer control line TL1. In addition, the second and fourth transfer transistors TX2 and TX4 of the first pixel 610 and the third and fourth transfer transistors TX3 and TX4 of the second pixel 620 may be controlled by the second transfer control signal TG2 transmitted through the second transfer control line TL2.

Figure 19:
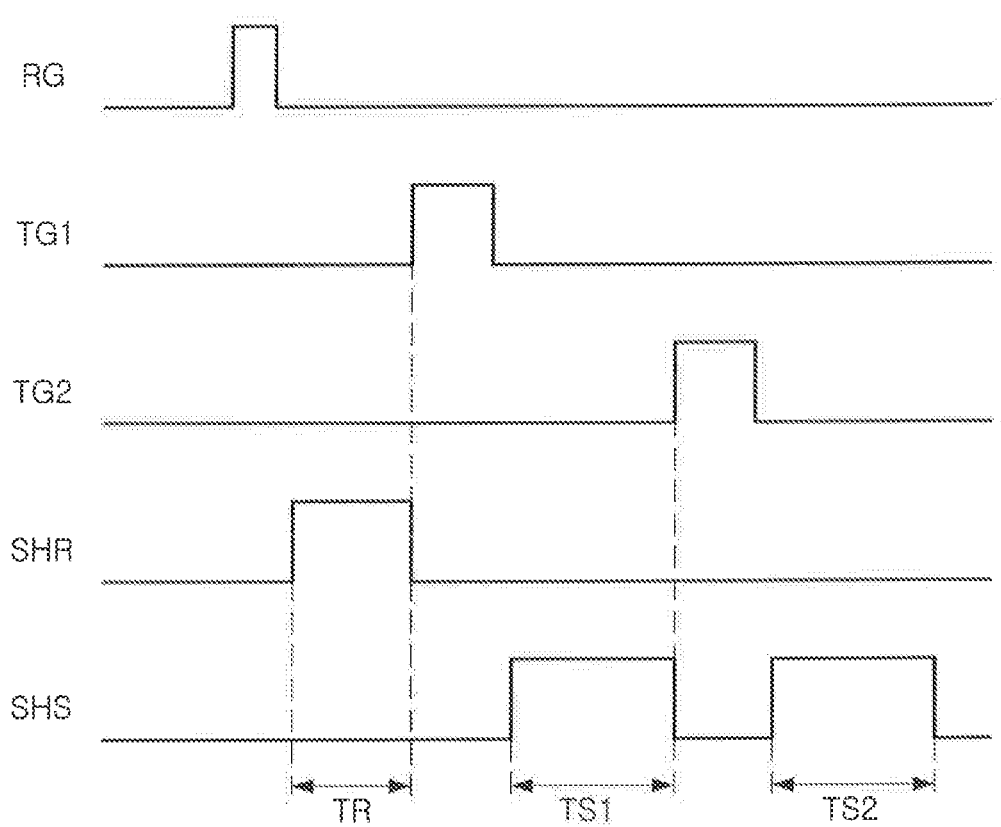
FIG. 19 is a timing diagram illustrating an operation of an image sensor, according to an example embodiment of the present inventive concept.

Referring to FIG. 19, an operation of an image sensor according to an example embodiment of the present inventive concept may be started by the reset transistor RX being turned on by the reset control signal RG. As the reset transistor RX is turned on, the floating diffusion region FD of the first pixel 610 and the second pixel 620 may be reset by the power supply voltage VDD. Referring to FIG. 19, after the reset transistor RX is turned off, the read-out circuit may sample the reset voltage of each of the first pixel 610 and the second pixel 620 during a reset sampling time TR in which a reset voltage sampling signal SHR has a high logic value.

When the reset sampling time TR elapses, the first and third transfer transistors TX1 and TX3 of the first pixel 610 and the first and second transfer transistors TX1 and TX2 of the second pixel 620 may be turned on by the first transfer control signal TG1. Therefore, the charges of the first and third photodiodes PD1 and PD3 of the first pixel 610 may move together to the floating diffusion region FD. Further, the charges of the first and second photodiodes PD1 and PD2 of the second pixel 620 may move together to the floating diffusion region FD.

When the first and third transfer transistors TX1 and TX3 of the first pixel 610 and the first and second transfer transistors TX1 and TX2 of the second pixel 620 are turned off, the read-out circuit may obtain the first pixel voltage at each of the first pixel 610 and the second pixel 620 in response to a pixel voltage sampling signal SHS. The first pixel voltage obtained by the read-out circuit at the first pixel 610 may be a voltage corresponding to the charges of the first and third photodiodes PD1 and PD3 of the first pixel 610. Further, the first pixel voltage obtained by the read-out circuit at the second pixel 620 may be a voltage corresponding to the charges of the first and second photodiodes PD1 and PD2 of the second pixel 620. The first pixel voltages obtained by the read-out circuit may be stored in, for example, a memory. For example, the memory may be a memory included in an image sensor and one semiconductor package.

When the first sampling time TS1 elapses, the second and fourth transfer transistors TX2 and TX4 of the first pixel 610 and the third and fourth transfer transistors TX3 and TX4 of the second pixel 620 may be turned on by the second transfer control signal TG2. Therefore, the charges of the second and fourth photodiodes PD2 and PD4 of the first pixel 610 may move together to the floating diffusion region FD. In addition, the charges of the third and fourth photodiodes PD3 and PD4 of the second pixel 620 may move together to the floating diffusion region FD.

In an example embodiment, there is not a period in which the floating diffusion region FD is reset by the reset control signal RG between the periods in which each of the first transfer control signal TG1 and the second transfer control signal TG2 has a high logic value. Therefore, while the second transfer control signal TG2 has a high logic value, in each of the floating diffusion regions FD of the first pixel 610 and the second pixel 620, the charges generated in the first to fourth photodiodes PD1 to PD4 may be accumulated.

When the second and fourth transfer transistors TX2 and TX4 of the first pixel 610 and the third and fourth transfer transistors TX3 and TX4 of the second pixel 620 are turned off by the second transfer control signal TG2, the read-out circuit may detect the pixel voltage during the second sampling time TS2. The pixel voltage detected by the read-out circuit from the first pixel 610 may be a voltage corresponding to the sum of the charges of the first to fourth photodiodes PD1 to PD4 of the first pixel 610. Similarly, the pixel voltage detected by the read-out circuit from the second pixel 620 may be a voltage corresponding to the sum of the charges of the first to fourth photodiodes PD1 to PD4 of the second pixel 620.

A control logic including the read-out circuit may generate image data using the pixel voltages detected at each of the first pixel 610 and the second pixel 620. In addition, the control logic may obtain a second pixel voltage by calculating the difference between the pixel voltage detected in each of the first pixel 610 and the second pixel 620 and the first pixel voltage. In the case of the first pixel 610, the second pixel voltage may be a voltage corresponding to charges generated in the second and fourth photodiodes PD2 and PD4. In the case of the second pixel 620, the second pixel voltage may be a voltage corresponding to charges generated in the third and fourth photodiodes PD3 and PD4.

The control logic may calculate the first pixel signal and the second pixel signal in each pixel of the plurality of pixels 610 to 640 using the first pixel voltage and the second pixel voltage obtained in the above-described manner. For example, the first pixel signal may be a signal corresponding to the charge generated in the first photodiode group PG1 of each pixel of the plurality of pixels 610 to 640, and the second pixel signal may be a signal corresponding to the charges generated in the second photodiode group PG2.

The control logic may calculate the phase difference between the first pixel signal and the second pixel signal to generate information necessary for focus adjustment of the image sensor. As illustrated in FIG. 17, since the first photodiode group PG1 and the second photodiode group PG2 are defined in different manners in at least a portion of the pixels 610 to 640, the control logic may generate information necessary to adjust the focus in various directions. At the same time, information necessary for focus adjustment, and image data, may be obtained only by a read-out operation less than the number of the photodiodes PD1 to PD4 included in each pixel of the plurality of pixels 610 to 640. Therefore, the time and power consumption required for the read-out operation may be reduced, and the influence of noise generated in the read-out operation may be reduced, thereby improving the performance of the image sensor.

As shown in the figures illustrating cross-sectional views of the plurality of photodiodes PD1 to PD4, according to example embodiments, at least some of the plurality of photodiodes PD1 to PD4 may be formed at about the same depth in the semiconductor substrate (e.g., the first layer 40 in FIG. 2) in which they are formed. For example, in example embodiments, the height of each of at least some of the plurality of photodiodes PD1 to PD4 may be about equal to each other. Further, in example embodiments, the distance between an upper surface of each of at least some of the plurality of photodiodes PD1 to PD4 and an upper surface of the semiconductor substrate in which they are formed may be about the same as each other.

Figure 20:
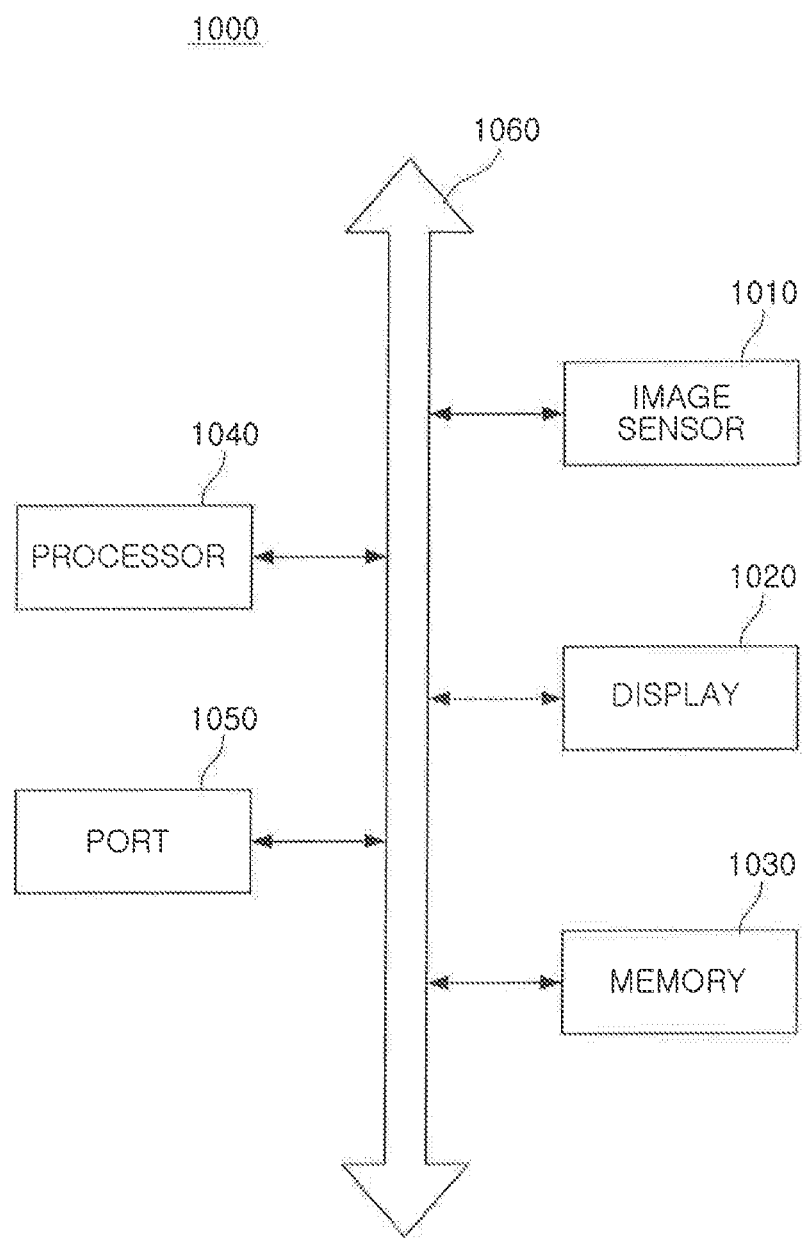
FIG. 20 is a block diagram illustrating an electronic device including an image sensor, according to an example embodiment of the present inventive concept.

FIG. 20 is a block diagram illustrating an electronic apparatus including an image sensor, according to an example embodiment of the present inventive concept.

A computer device 1000 according to the example embodiment illustrated in FIG. 20 may include an image sensor 1010, a display 1020, a memory 1030, a processor 1040, and a port 1050. In addition, the computer device 1000 may further include a wired/wireless communication device, a power supply device, etc. Among the components illustrated in FIG. 20, the port 1050 may used, for example, to communicate with a video card, a sound card, a memory card, a USB device, etc. The computer device 1000 may be, for example, a desktop computer or a laptop computer, a smartphone, a tablet PC, a wearable device such as a smartwatch, etc.

The processor 1040 may perform specific operations or commands, tasks, etc. The processor 1040 may be, for example, a central processing unit CPU or a microprocessing unit MCU, a system on chip SOC, etc., and may communicate with the image sensor 1010, the display 1020, and the memory 1030, as well as other devices connected to the port 1050 via a bus 1060.

The memory 1030 may be a storage medium that stores data necessary for the operation of the computer device 1000, multimedia data, etc. The memory 1030 may include a volatile memory such as a random access memory RAM, or a non-volatile memory, such as a flash memory. In addition, the memory 1030 may also include at least one of a solid state drive SSD, a hard disk drive HDD, and an optical drive ODD as a storage device. The input/output device may include an input device such as a keyboard, a mouse, a touch screen, etc., and an output device such as a display, an audio output unit, etc.

The image sensor 1010 may be mounted on a package substrate and connected to the processor 1040 by the bus 1060 or other communication means. The image sensor 1010 may be employed in the computer device 1000 in the form of the various example embodiments described with reference to FIGS. 1 to 19.

As is traditional in the field of the present inventive concept, example embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, etc., which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions.

As set forth above, according to example embodiments of the present inventive concept, by reading pixel voltages corresponding to charges generated in at least a part of a plurality of photodiodes included in each of a plurality of pixels of an image sensor substantially simultaneously, the read-out time and the power consumed in the read-out operation may be reduced.

While the present inventive concept has been particularly shown and described with reference to the example embodiments thereof, it will be understood by those of ordinary skill in the art that various changes in form and detail may be made therein without departing from the spirit and scope of the present inventive concept as defined by the following claims.

What is claimed is:

1. An image sensor, comprising:
a pixel array comprising a plurality of pixels arranged in a first direction and a second direction,
wherein each of the plurality of pixels comprises a plurality of photodiodes commonly disposed below a single color filter and divided into a first photodiode group and a second photodiode group, and
at least one of the first photodiode group and the second photodiode group comprises two or more of the plurality of photodiodes being adjacent to one another in at least one of the first direction and the second direction; and a control logic configured to generate image data by obtaining pixel signals from the plurality of pixels, and simultaneously read a pixel voltage corresponding to charges generated by two or more of the plurality of photodiodes included in at least one of the first photodiode group and the second photodiode group of one of the plurality of pixels, wherein the control logic detects a first pixel voltage corresponding to a charge generated by the first photodiode group by turning on the first transfer transistor, detects a sum pixel voltage corresponding to a sum of charges generated by the first photodiode group and the second photodiode group by turning on the second transfer transistor, and detects a second pixel voltage corresponding to a charge generated by the second photodiode group by calculating a difference between the sum pixel voltage and the first pixel voltage, and the control logic does not reset the floating diffusion region before detecting the sum pixel voltage after detecting the first pixel voltage.

2. The image sensor of claim 1, wherein each of the plurality of pixels comprises:
a device connection layer disposed at a lower portion of the plurality of photodiodes,
wherein the device connection layer separates the plurality of photodiodes into the first photodiode group and the second photodiode group by connecting at least portions of the plurality of photodiodes to each other; and
a pixel circuit disposed below the device connection layer.

3. The image sensor of claim 2, wherein the pixel circuit comprises:
a first transfer transistor connected to the first photodiode group;
a second transfer transistor connected to the second photodiode group; and
a floating diffusion region connected to the first transfer transistor and the second transfer transistor.

4. The image sensor of claim 2, wherein the device connection layer is an area doped with an N-type impurity.

5. The image sensor of claim 2, wherein a light receiving area of the first photodiode group is different from a light receiving area of the second photodiode group in at least one of the plurality of pixels.

6. The image sensor of claim 2, wherein a light receiving area of the first photodiode group is the same as a light receiving area of the second photodiode group in at least one of the plurality of pixels.

7. The image sensor of claim 3, wherein the pixel circuit further comprises:
a driving transistor that generates a voltage corresponding to charges accumulated in the floating diffusion region;
a selection transistor that outputs a voltage generated by the driving transistor to the control logic; and
a reset transistor that resets the floating diffusion region.

8. The image sensor of claim 1, wherein the control logic provides an autofocusing function using the first pixel voltage and the second pixel voltage.

9. The image sensor of claim 1, wherein the control logic generates the image data using the sum pixel voltage.

10. The image sensor of claim 1, wherein each of the plurality of pixels comprises:
a plurality of transfer transistors connected to the plurality of photodiodes, respectively; and
a plurality of connection lines that separates the plurality of photodiodes into the first photodiode group and the second photodiode group by connecting at least a portion of gate electrode layers of the plurality of transfer transistors to each other.

11. The image sensor of claim 10, wherein the first photodiode group is provided at different positions in a portion of pixels adjacent to each other among the plurality of pixels.

12. The image sensor of claim 10, wherein the connection lines comprise:
a first connection line that connects the photodiodes included in the first photodiode group to each other; and
a second connection line that connects the photodiodes included in the second photodiode group to each other.

13. The image sensor of claim 12, wherein the control logic detects the first pixel voltage by turning on transfer transistors connected to the first connection line, detects the sum pixel voltage by turning on transfer transistors connected to the second connection line, and detects the second pixel voltage by calculating a difference between the sum pixel voltage and the first pixel voltage.

14. The image sensor of claim 13, wherein the control logic generates the image data using the sum pixel voltage, and provides an autofocusing function using the first pixel voltage and the second pixel voltage.

15. The image sensor of claim 10, wherein a light receiving area of the first photodiode group is the same as a light receiving area of the second photodiode group.

16. The image sensor of claim 1, wherein the control logic obtains information for providing an autofocusing function in a different direction from at least a portion of the plurality of pixels.

17. An image sensor, comprising:
a pixel array comprising a plurality of pixels arranged in a first direction and a second direction, wherein each of the plurality of pixels comprises a plurality of photodiodes divided into a first photodiode group and a second photodiode group, and at least one of the first photodiode group and the second photodiode group comprises two or more of the plurality of photodiodes being adjacent to one another in at least one of the first direction and the second direction; and
a control logic configured to generate image data by obtaining pixel signals from the plurality of pixels, and simultaneously read a pixel voltage corresponding to charges generated by two or more of the plurality of photodiodes included in one of the plurality of pixels,
wherein each of the plurality of pixels comprises:
a device connection layer disposed at a lower portion of the plurality of photodiodes,
wherein the device connection layer separates the plurality of photodiodes into the first photodiode group and the second photodiode group by connecting at least portions of the plurality of photodiodes to each other; and
a pixel circuit disposed below the device connection layer,
wherein the pixel circuit comprises:
a first transfer transistor connected to the first photodiode group;
a second transfer transistor connected to the second photodiode group; and
a floating diffusion region connected to the first transfer transistor and the second transfer transistor,
wherein the control logic detects a first pixel voltage corresponding to a charge generated by the first photodiode group by turning on the first transfer transistor, detects a sum pixel voltage corresponding to a sum of charges generated by the first photodiode group and the second photodiode group by turning on the second transfer transistor, and detects a second pixel voltage corresponding to a charge generated by the second photodiode group by calculating a difference between the sum pixel voltage and the first pixel voltage.

18. An image sensor, comprising:
a pixel array comprising a plurality of pixels arranged in a first direction and a second direction, wherein each of the plurality of pixels comprises a plurality of photodiodes divided into a first photodiode group and a second photodiode group, and at least one of the first photodiode group and the second photodiode group comprises two or more of the plurality of photodiodes being adjacent to one another in at least one of the first direction and the second direction; and
a control logic configured to generate image data by obtaining pixel signals from the plurality of pixels, and simultaneously read a pixel voltage corresponding to charges generated by two or more of the plurality of photodiodes included in one of the plurality of pixels,
wherein each of the plurality of pixels comprises:
a plurality of transfer transistors connected to the plurality of photodiodes, respectively; and
a plurality of connection lines that separates the plurality of photodiodes into the first photodiode group and the second photodiode group by connecting at least a portion of gate electrode layers of the plurality of transfer transistors to each other,
wherein the connection lines comprise:
a first connection line that connects the photodiodes included in the first photodiode group to each other; and
a second connection line that connects the photodiodes included in the second photodiode group to each other,
wherein the control logic detects a first pixel voltage corresponding to a charge generated by the first photodiode group by turning on transfer transistors connected to the first connection line, detects a sum pixel voltage corresponding to a sum of charges generated by the first photodiode group and the second photodiode group by turning on transfer transistors connected to the second connection line, and detects a second pixel voltage corresponding to a charge generated by the second photodiode group by calculating a difference between the sum pixel voltage and the first pixel voltage.

* * * * *